(12) United States Patent
Mao et al.

(10) Patent No.: US 12,500,124 B2
(45) Date of Patent: Dec. 16, 2025

(54) METHOD OF SINGULATING A SEMICONDUCTOR DEVICE

(71) Applicant: Taiwan Semiconductor Manufacturing Co., Ltd., Hsinchu (TW)

(72) Inventors: Yi-Chao Mao, Zhongli (TW); Tsung-Fu Tsai, Changhua (TW); Szu-Wei Lu, Hsinchu (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 658 days.

(21) Appl. No.: 17/721,109

(22) Filed: Apr. 14, 2022

(65) Prior Publication Data

US 2023/0230882 A1    Jul. 20, 2023

Related U.S. Application Data

(60) Provisional application No. 63/266,768, filed on Jan. 14, 2022.

(51) Int. Cl.
| | |
|---|---|
| H01L 21/78 | (2006.01) |
| H01L 21/02 | (2006.01) |
| H01L 21/683 | (2006.01) |
| H01L 23/00 | (2006.01) |
| H01L 23/544 | (2006.01) |

(52) U.S. Cl.
CPC ........ *H01L 21/78* (2013.01); *H01L 21/02076* (2013.01); *H01L 21/6836* (2013.01); *H01L 23/544* (2013.01); *H01L 24/08* (2013.01); *H01L 24/80* (2013.01); *H01L 2221/68327* (2013.01); *H01L 2223/5446* (2013.01); *H01L 2224/08145* (2013.01); *H01L 2224/80895* (2013.01); *H01L 2224/80896* (2013.01)

(58) Field of Classification Search
CPC .................................................. H01L 21/78–86
See application file for complete search history.

(56) References Cited

U.S. PATENT DOCUMENTS

| | | | | |
|---|---|---|---|---|
| 5,128,282 | A | * | 7/1992 | Ormond ................ H10F 71/121 |
| | | | | 257/E21.237 |
| 6,803,247 | B2 | | 10/2004 | Sekiya |
| 9,484,227 | B1 | * | 11/2016 | Cheng .................... H01L 25/50 |
| 2003/0216009 | A1 | * | 11/2003 | Matsuura ............. H10D 30/668 |
| | | | | 257/E23.179 |
| 2005/0035100 | A1 | | 2/2005 | Genda |

(Continued)

FOREIGN PATENT DOCUMENTS

| | | |
|---|---|---|
| CN | 104979187 A | 10/2015 |
| DE | 102008049059 A1 | 5/2009 |

(Continued)

*Primary Examiner* — Eric A. Ward
(74) *Attorney, Agent, or Firm* — Slater Matsil, LLP

(57) ABSTRACT

Embodiments provide a precutting technique to cut parallel openings at a front surface of a device wafer, then flipping the device wafer over and completing the cut from the back side of the device wafer to singulate a die from the wafer. The precutting technique and back side cutting technique combined provides an indentation in the side surface(s) of the device.

20 Claims, 20 Drawing Sheets

(56) References Cited

U.S. PATENT DOCUMENTS

| | | | |
|---|---|---|---|
| 2006/0223234 A1* | 10/2006 | Terayama | H01L 21/6836 438/460 |
| 2007/0105345 A1 | 5/2007 | Kurosawa | |
| 2008/0006900 A1* | 1/2008 | Chan | H01L 21/563 257/E23.125 |
| 2009/0121321 A1 | 5/2009 | Miccoli et al. | |
| 2018/0076088 A1* | 3/2018 | Sandoh | H01L 21/304 |
| 2019/0164783 A1* | 5/2019 | Huang | H01L 24/20 |
| 2021/0252742 A1 | 8/2021 | Yamamoto | |
| 2022/0328355 A1* | 10/2022 | Mackh | H01L 21/6836 |

FOREIGN PATENT DOCUMENTS

| | | |
|---|---|---|
| JP | 2005064231 A | 3/2005 |
| KR | 20190064387 A | 6/2019 |
| KR | 20210103943 A | 8/2021 |
| TW | 201926585 A | 7/2019 |
| TW | 201945492 A | 12/2019 |
| WO | 2019181403 A1 | 9/2019 |

\* cited by examiner

METHOD OF SINGULATING A SEMICONDUCTOR DEVICE

PRIORITY CLAIM AND CROSS-REFERENCE

This application claims priority to U.S. Provisional Patent Application No. 63/266,768 filed Jan. 14, 2022, entitled "Semiconductor Device and Method of Manufacturing the Same," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (POP) technology. In a PoP package, a top semiconductor packages is stacked on top of a bottom semiconductor package to allow high level of integration and component density. Another example is the Multi-Chip-Module (MCM) technology, where multiple semiconductor dies are packaged in one semiconductor package to provide semiconductor devices with integrated functionalities.

The high level of integration of advanced packaging technologies enables production of semiconductor devices with enhanced functionalities and small footprints, which is advantageous for small form factor devices such as mobile phones, tablets and digital music players. Another advantage is the shortened length of the conductive paths connecting the interoperating parts within the semiconductor package. This improves the electrical performance of the semiconductor device, since shorter routing of interconnections between circuits yields faster signal propagation and reduced noise and cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 7A, 7B, 7C, and 7D illustrate various views of intermediate processes of singulating a device die from a wafer, in accordance with some embodiments.

FIGS. 8 through 10A, 10B, 10C, and 10D illustrate various views of intermediate processes of singulating a device die from a wafer, in accordance with some embodiments.

DETAILED DESCRIPTION

Figure 1:
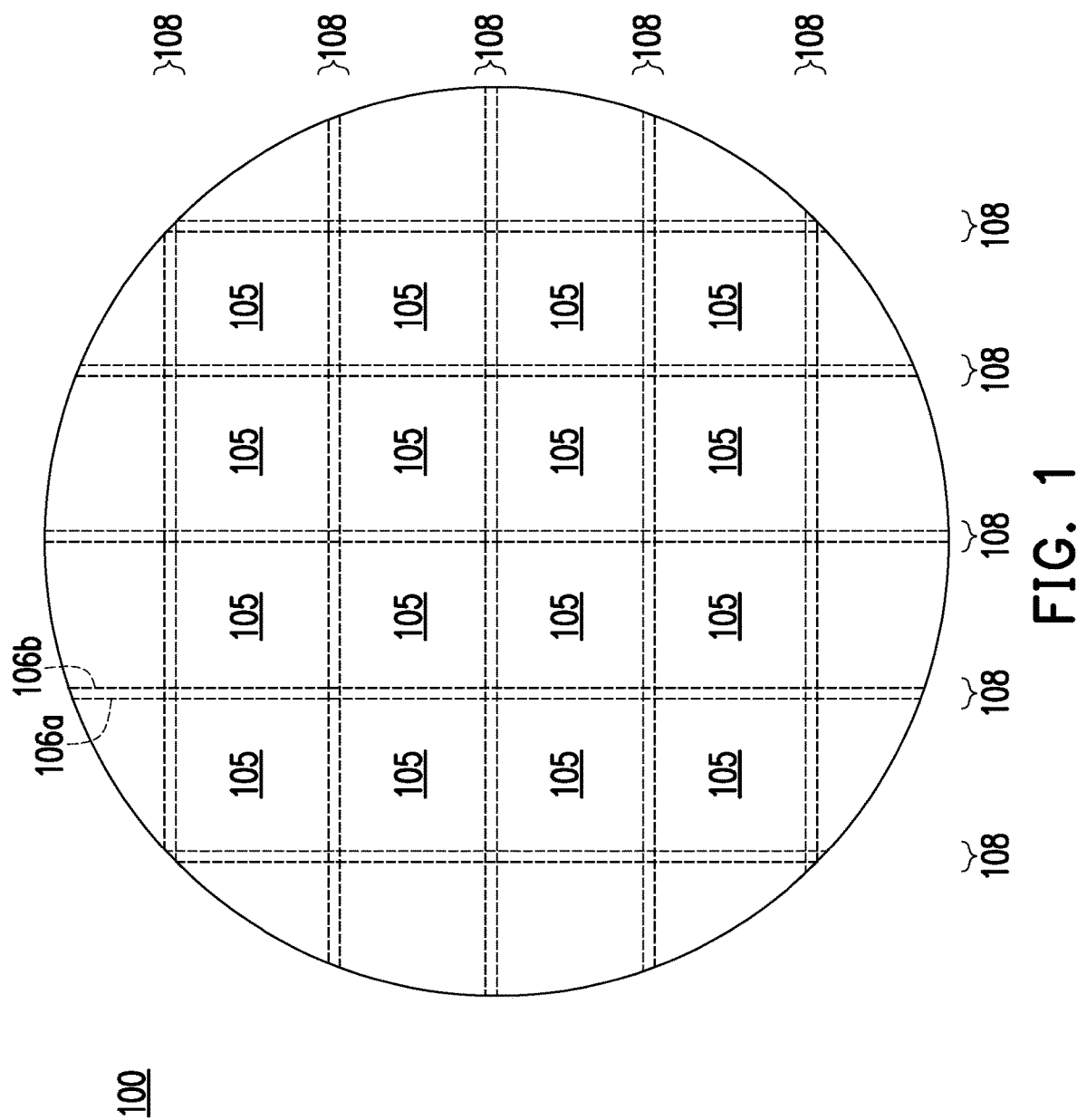

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of semiconductor devices and methods of forming the semiconductor devices, and incorporating the semiconductor devices into semiconductor packages, such as integrated fan-out (InFO) semiconductor packages, fan-out Package-on-Package (PoP) semiconductor packages, Chip-on-Wafer-on-Substrate (CoWoS) semiconductor packages, Flip-Chip semiconductor packages, and the like.

Multiple semiconductor devices may be formed in a single semiconductor wafer, then following the formation of the semiconductor devices, the semiconductor devices may be separated from one another through a singulation process. The singulation process uses some process to cut through the semiconductor wafer to release each of the semiconductor devices from the wafer. Some portions of the wafer are discarded. The singulation process used to cut through the semiconductor wafer can utilize mechanical saws, lasers, plasma cutting, or chemical etching to perform the singulation. Each of these processes has disadvantages or advantages over the others and may be used depending on the circumstances in which they are implemented. They may, however, share various disadvantages, which embodiments of the present disclosure reduce.

The singulation process may be untidy. Sawing, for example, can create a lot of debris as the blade cuts through the semiconductor wafer. As another example, etching can create chemical by products that may need to be chemically cleaned away, potentially damaging the semiconductor devices. As another example, the cutting process used by plasma or lasers may cause superheated materials to recast on the surfaces of the semiconductor devices. Each of these singulation processes may form cleaning cutting byproducts, such as debris, recast, or chemical byproducts. Embodiment processes reduce the creation of cutting byproducts.

Another issue with the singulation process is the propensity for chipping to occur in the singulation process. For example, in the case of mechanical separation by a saw, the blade can cause chipping along the edge of the cut where the saw passes through the semiconductor wafer. Embodiment processes reduce the chipping of the semiconductor wafer.

FIGS. 1 through 7D illustrate a singulation process for separating packages from a multi-package form into a singular form. Embodiment processes use multiple cuts to achieve a cleaner result from the singulation process. FIG. 1 illustrates a wafer 100 including several device regions 105 formed therein. The dicing lines 106a and 106b (together, referred to as dicing lines 106) illustrate individual dicing lines between the device regions 105. The dicing lines 106 are positioned toward the outer edges of a non-device area (or dicing region 108) disposed between each of the device regions 105. Although a round wafer 100 is depicted, the wafer 100 may be any suitable shape, or in some embodiments, may be a wafer-on-wafer, a chip-on-wafer-on-substrate, or a package-on-wafer in which the device regions 105 are package regions which are singulated using embodiment processes.

Figure 2:
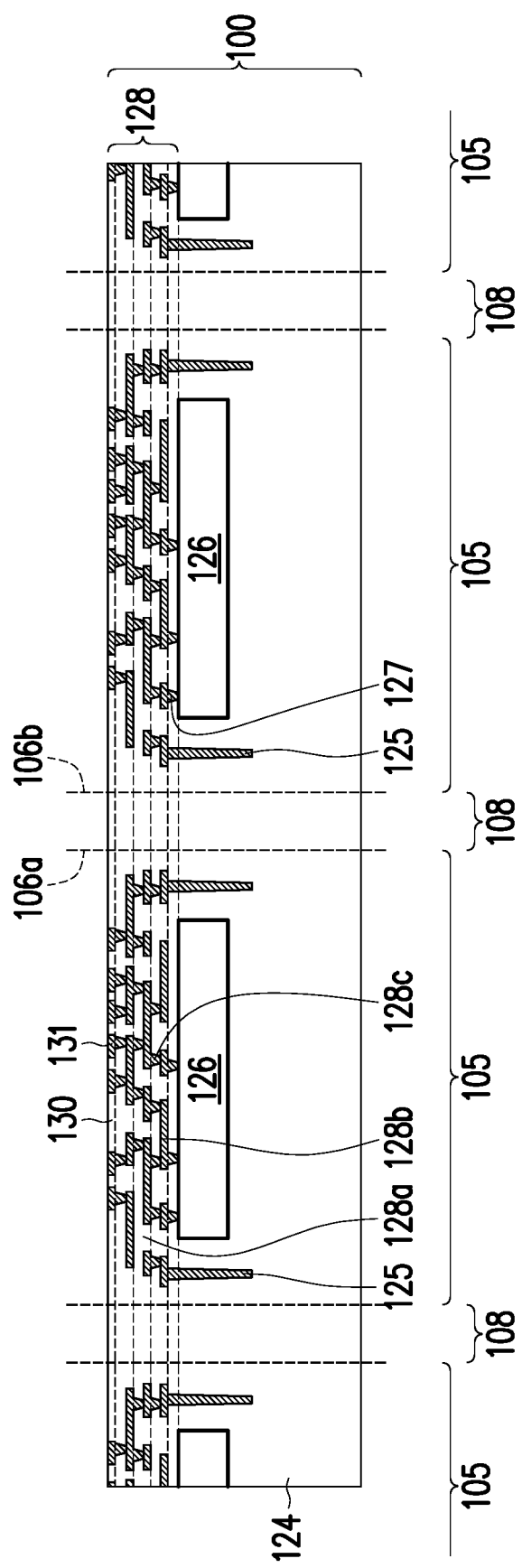

FIG. 2 illustrates a representative portion of a cross-sectional view through the wafer 100. The wafer 100 illustrated in FIG. 2 includes a substrate 124, an optional embedded device area 126, and an interconnect structure 128 overlying the device area 126. Each of the device regions 105 are illustrated. In some embodiments, each of the device regions 105 may have a same design, while in other embodiments, one or more of the device regions may have unique designs. Each of the device regions 105 may correspond to a particular device function. For example, the device regions 105 may correspond to a logic die, a memory die, an RF die, a photonic die, and so forth. Dicing lines 106a and 106b are illustrated as being disposed through a portion of the dicing region 108.

In some embodiments, the optional device area 126 may be formed directly from portions of the substrate 124, while in other embodiments, the optional device area 126 may include a separate die which is attached to the substrate 124. In some embodiments, such as when the device region 105 corresponds to an interposer, the device area 126 may be omitted. The semiconductor substrate 124 may be, for example, silicon, doped or undoped, or an active layer of a semiconductor-on-insulator (SOI) substrate. The semiconductor substrate 124 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

The interconnect structure 128 may be, for example, a redistribution structure, which includes a plurality of dielectric layers 128a and a plurality of metallization patterns 128b coupled together by vias 128c. The interconnect structure 128 is formed over the device area 126 and may electrically couple signals from the device area 126 to contact pads 131 and/or electrically couple certain contact pads 131 to other contact pads 131, depending on the desired design.

The interconnect structure 128 may be formed by a process of depositing a dielectric layer, patterning the dielectric layer to form openings therein, and forming metallization lines over the dielectric layer and through the openings. A first dielectric layer 128a, which is one of the dielectric layers 128a, is formed over the substrate 124. In embodiments which utilize the device area 126, the first dielectric layer 128a is also formed over the device area 126. In accordance with some embodiments of the present disclosure, the first dielectric layer 128a is formed of or comprises an organic material, which may be a polymer. The organic material may also be a photo-sensitive material. For example, the dielectric layer 128a may be formed of or comprise polyimide, polybenzoxazole (PBO), benzocyclobutene (BCB), or the like. In some embodiments, the first dielectric layer 128a is then patterned to form via openings therein, exposing conductive features of the device area 126.

Metallization patterns 128b (e.g., redistribution lines (RDLs)) are formed on the first dielectric layer 128a. In accordance with some embodiments, the formation of the metallization patterns 128b may include depositing a blanket metal seed layer extending into the via openings, and forming and patterning a plating mask (such as a photoresist), with openings formed in the plating mask and directly over the via openings. A plating process is then performed to plate a metallic material, which fully fills the via openings, and has some portions higher than the top surface of dielectric layer 128a. The plating mask is then removed, followed by an etching process to remove the exposed portions of the metal seed layer, which was previously covered by the plating mask. The remaining portions of the metal seed layer and the plated metallic material are the metallization patterns 128b and vias 128c. Each of the vias 128c may have a tapered profile, with the upper portions wider than the corresponding lower portions.

The metal seed layer and the plated metallic material may be formed of the same material or different materials. For example, the metal seed layer may include a titanium layer, and a copper layer over the titanium layer. The plated metallic material in metallization patterns 128b and vias 128c may include a metal or a metal alloy including copper, aluminum, tungsten, or the like, or alloys thereof. It is appreciated that there may be more dielectric layers and RDLs formed.

The process of forming the first dielectric layer 128a, metallization patterns 128b, and vias 128c may be repeated any number of desired times until a desired number of layers of the interconnect structure 128 are formed. It is appreciated that the material of each of the dielectric layers 128a may be formed using materials selected from the same group (or different group) of candidate materials as the first dielectric layer 128a and subsequent dielectric layers 128a. For example, the first dielectric layer 128a may be formed of an organic material, which may be a polymer such as polyimide, PBO, BCB, or the like. Subsequently formed dielectric layers 128a may be formed using the same material or a different material from the candidate materials.

In some embodiments, prior to forming the interconnect structure 128, deep vias 125 may be formed adjacent (or through) the device area 126 and extend into the substrate 124 beyond. The deep via 125 may be exposed from the reverse side of the device region 105 in a subsequent process and used to couple conductive features (e.g., contact pads formed) on the reverse side of the device region 105 to conductive features (by way, for example, of the metallization patterns 128b and vias 128c) on the front side of the device region 105. The deep vias 125 may be formed by etching corresponding openings using a suitable photoetching process, then forming the deep vias 125 in the openings. In some embodiments, the deep vias 125 may be formed by depositing an optional barrier layer in the openings, followed by a metal seed layer, and then followed by a conductive fill. The optional barrier layer and metal seed layer may be deposited using a PVD, CVD, or ALD process, and the conductive fill may be deposited using a metal plating process. The optional barrier layer may be made of titanium nitride or another suitable material. The metal seed layer and conductive fill may be made of any suitable metal or metal alloy, such as tungsten, copper, cobalt, aluminum, the like, or combinations thereof. Other suitable processes and materials may be used to form the deep vias 125.

In some embodiments, the vias 128c may be formed in part or in whole using simultaneous processes as the deep vias 125. For example, the openings for the deep vias 125 and the openings for the vias 128c may be formed using distinct processes and the seed layer, then when forming the metallization patterns 128b and vias 128c, the deep vias 125 may be formed simultaneously.

Figure 3:
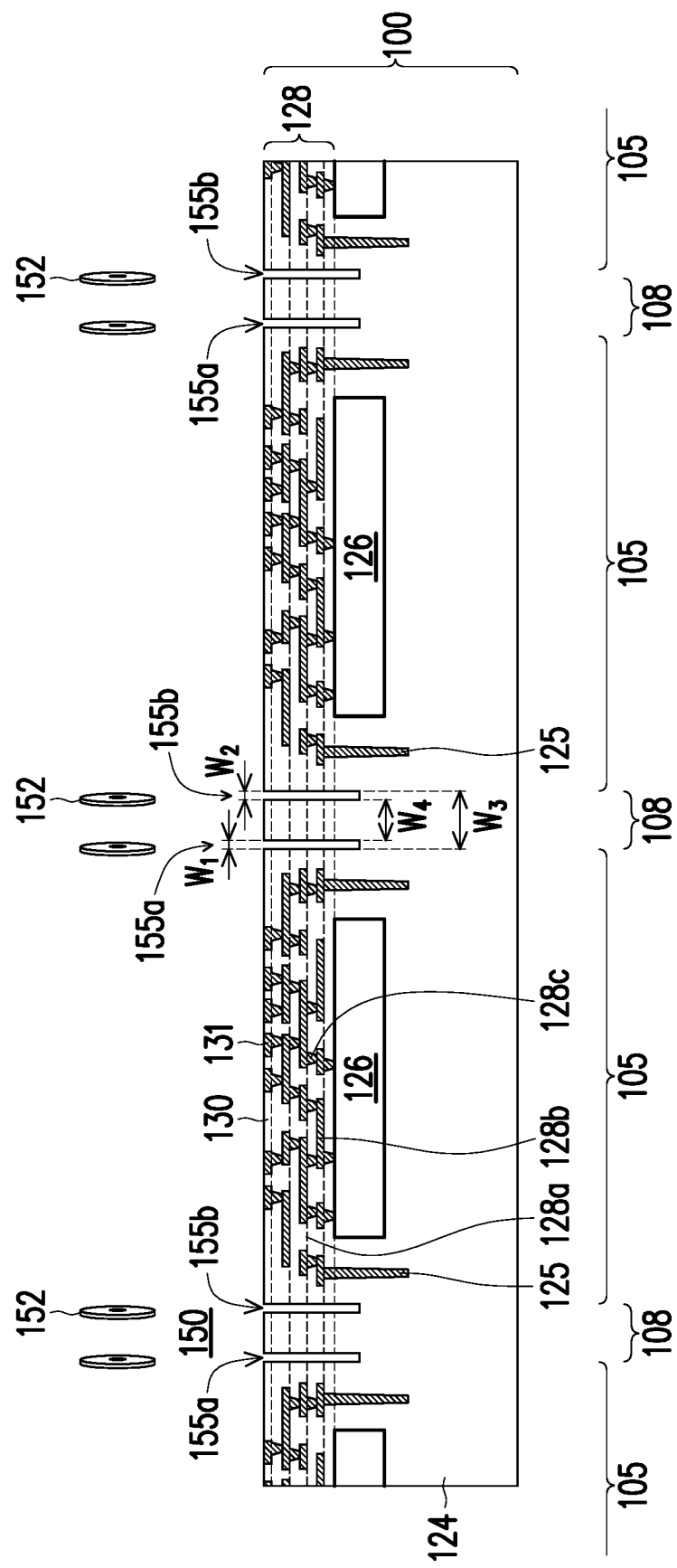

Referring to FIG. 3, a precutting 150 is performed using a cutting process 152, in accordance with some embodiments, to form openings 155a and 155b in the dicing regions 108 between adjacent device regions 105 along the dicing lines 106a and 106b (FIG. 2). As illustrated in FIG. 3, the opening 155a is formed proximate to one of the device regions 105 and the opening 155b is formed proximate to an adjacent one of the device regions 105. The width $W_1$ of the opening 155a is between about 5 μm and about 30 μm, and the width $W_2$ of the opening 155b is between about 5 μm and about 30 μm. In some embodiments, the width $W_1$ is substantially the same as the width $W_2$. In other embodiments, the width $W_1$ is different from the width $W_2$. A width $W_3$ measured between an outer sidewall of the opening 155a and an outer sidewall of the opening 155b is between about 60 μm and about 200 μm (the outer sidewalls being those closest to the device regions 105). A width $W_4$ measured between an inner sidewall of the opening 155a and an inner sidewall of the opening 155b is between about 20 μm and about 190 μm. The rectangular cross-sections of the openings 155a and 155b illustrated in FIG. 3 are merely non-limiting examples. Other shapes for the cross-sections of the openings 155a and 155b are possible and are fully intended to be included within the scope of the present disclosure. For example, the bottoms of the openings 155a and 155b may have irregular shapes depending on, e.g., the method used to form the openings.

In forming the openings 155a and 155b, portions of the dielectric layers of the interconnect structure 128 may be removed. The openings 155a and 155b are physically separated from each other by a remaining portion of the dielectric layers of the interconnect 128 in the dicing region 108. In some embodiments, the width of the remaining portion of the dielectric layers of the interconnect structure 128 is corresponds to the width W4. In addition, the openings 155a and 155b may extend into the substrate 124. Therefore, in the illustrated embodiment, the openings 155a and 155b extend through the interconnect structure 128 and into the substrate 124. For example, the openings 155a and 155b may extend into the substrate 124 by a depth in a range between about 0 μm and 150 μm.

The cutting process 152 may utilize any suitable cutting techniques, such as cutting by plasma, lasers, saws, etching, the like, or combinations thereof. In embodiments where the cutting process 152 uses plasma or etching, a mask may be formed over the interconnect structure 128 and patterned to form openings corresponding to the openings 155a and 155b. Then plasma or chemical etching may be used to cut the openings 155a and 155b. In embodiments where lasers are used to perform the cutting process 152, the laser used may be a CO2 laser, a UV laser, or a green light laser, in some embodiments. Other types of lasers, such as fiber laser and Yttrium-Aluminum-Garnet (YAG) laser, are also contemplated. In embodiments where a saw is used, the saw may be a rotating circular saw blade and may include a square, angled, pointed, or rounded blade tip profile.

The openings 155a and 155b are formed by the precutting 150. Each opening provides protection against cracking and/or delamination for an adjacent device region 105 in a subsequent dicing process, as will be discussed in greater detail below. In particular, the opening 155a protects the interconnect structure 128, substrate 124, and device region 105 nearest the opening 155a, while the opening 155b likewise protects the interconnect structure 128, substrate 124, and device region 105 nearest the opening 155b. The relatively narrow openings 155a and 155b do not produce much debris or cutting by products as compared one or more larger openings 155a and 155b. Further, because they are narrow, the likelihood of delamination, chipping, cracking, or other damage is reduced for the interconnect structure 128 for each of the adjacent device regions 105.

Figure 4:
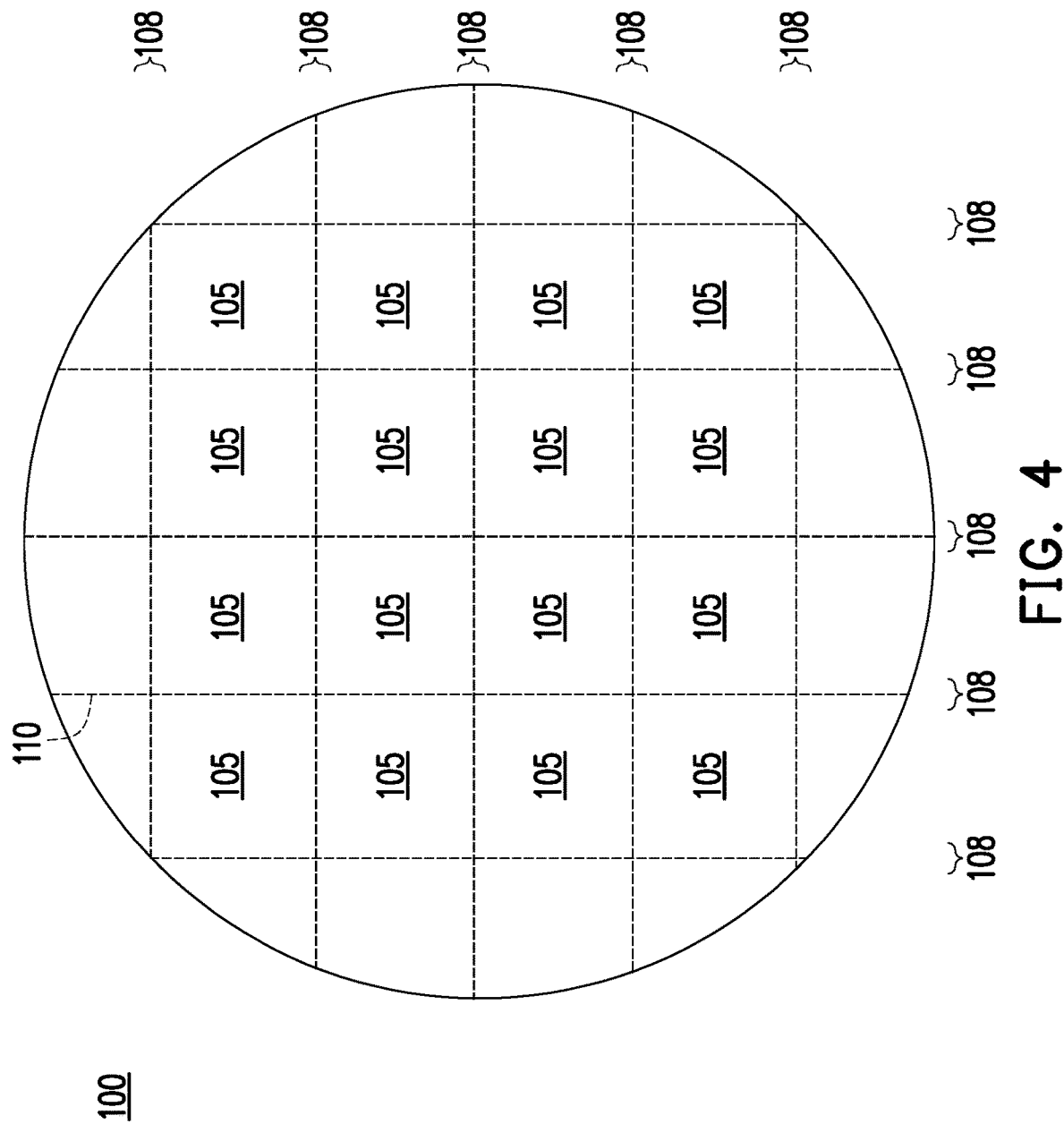
Figure 5:
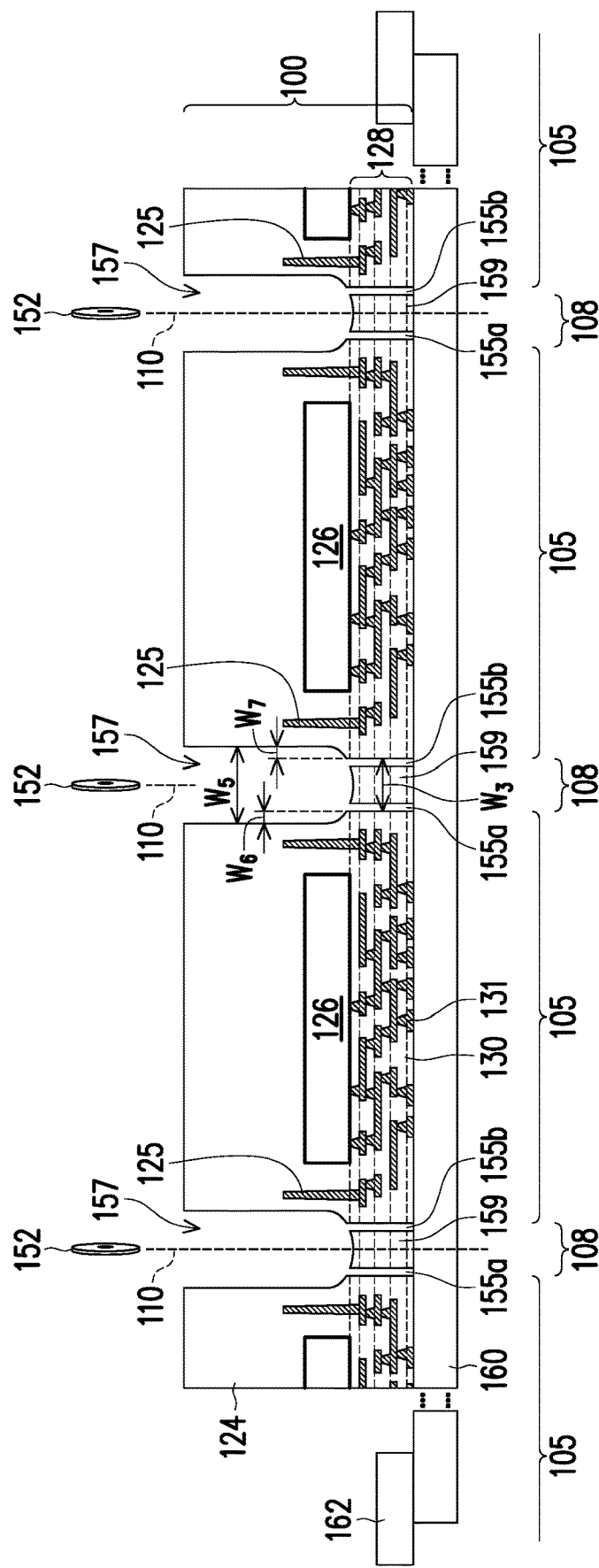

Next, in FIG. 4, the wafer 100 shown in FIG. 3 is flipped over, and in FIG. 5 attached to a tape 160 (e.g., a dicing tape) supported by a frame 162. A dicing process is performed to separate the device regions 105 from each other into a plurality of individual devices by cutting through the back side of the wafer 100 along the dicing lines 110 which are approximately in the middle of the dicing regions 108.

As illustrated in FIG. 5, an opening 157 is formed in each of the dicing regions 108 by using a cutting process 152. The cutting process 152 may correspond to the same or a different cutting process used to form the openings 155a and 155b. If a different cutting process, then the cutting process 152 may be selected from any of the candidate cutting processes discussed above, or may use another suitable cutting process. The width $W_5$ of the openings 157 created by the cutting process 152 in FIG. 5 is sufficient to be wider than the width $W_3$ of FIG. 3. That is, the opening 157 is extends approximately equidistantly beyond the outer sidewalls of each of the openings 155a and 155b. In some embodiments, the width $W_5$ is greater than the width $W_3$ and may be between about 80 μm and 300 μm. The distance $W_6$ between the outer sidewall of the opening 155a and the sidewall of the opening 157 may be between about 0 μm and 100 μm, though other dimensions are contemplated and may be used. The distance $W_7$ between the outer sidewall of the opening 155b and the sidewall of the opening 157 may be between about 0 μm and 100 μm, though other dimensions are contemplated and may be used. In some embodiments the distance $W_6$ and the distance $W_7$ may be equal, while in other embodiments, such as discussed in further detail below, the distances $W_6$ and $W_7$ may be different. The depth of the opening 157 exposes the bottoms of the openings 155a and 155b and effectively cuts through the remainder of the substrate 124. A remnant portion 159 may be discarded or recycled.

Because the wafer 100 is face down on the tape 160 the face of the wafer 100 is protected from debris and byproducts resulting from the more aggressive cutting process 152 used to make the much wider openings 157. Following the formation of the openings 157, an aggressive cleaning process may be used to clean the debris and byproducts resulting from the cutting process 152 without exposing the face of the wafer 100 and interconnect 128 to the cleaning process. Further, because of the precutting, when the device region 105 is released as a singulated device, chipping and delamination of the interconnect structure 128 is minimized.

Figure 6:
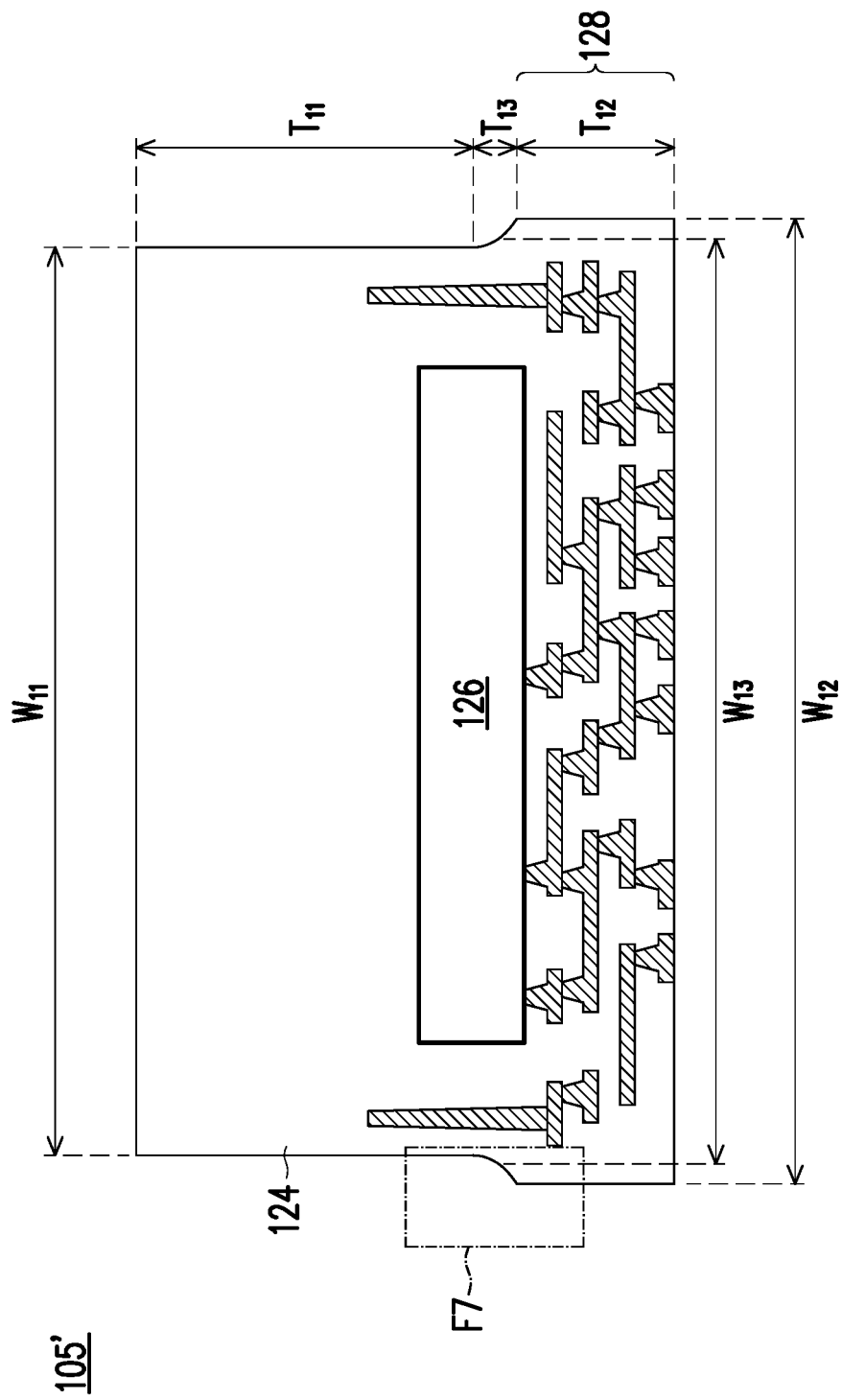

FIG. 6 illustrates the device 105' resulting from the singulation of the device regions 105. The device 105' has a first width W11 corresponding to the width of the substrate 124 and continuing for a thickness T11 of the device 105' as measured from a back side of the device 105'. The device 105' has a second width W12 corresponding to the width of the interconnect structure 128 and continuing for a thickness T12 of the device 105' as measured from the front side of the device 105' (i.e., at the front of the interconnect structure 128). The width W11 is less than the width W12. The device 105' has a width W13, which may be a varying width as the device 105' transitions from the first width W11 to the second width W12. Thus, the width W13 corresponds to a thickness T13 of the device 105' which is a thickness of the device 105' interposed between the thickness T11 and the thickness T12. The dashed box F7 is shown in an enlarged view and discussed in further detail below.

Still referring to the device 105' of FIG. 6, it is appreciated that due to the precutting and singulation cutting processes, various relationships between these widths and thicknesses may be described. In accordance with some embodiments, the thicknesses T11 may be less than, equal to, or greater than the thickness T12. For example, a ratio of the thicknesses T11 to T12 may be between about 40:1 and about 1:5. The thickness T13 may be less than the thickness T11. For example, the thickness T13 may be greater than or equal to zero. Further, the thickness T13 may be less than, equal to, or greater than the thickness T12. The thickness T11 plus the thickness T13 may be equal to the depth of the opening 157. The thickness T12 may be equal to the depth of the opening 155a (or 155b). Finally, as suggested above, the sidewall roughness (e.g., root-mean-square (RMS) roughness) of the second thickness T12 is less than the sidewall roughness of the first thickness T11 and less than the sidewall roughness of the third thickness T13.

FIGS. 7A, 7B, 7C, and 7D illustrate enlarged sidewall profiles of the device 105', in accordance with various embodiments. In particular the transition in the thickness T13 is shown which extends between the sidewall 155sw (the sidewall of the opening 155a or the opening 155b) and the sidewall 157sw1 (the sidewall of the opening 157 which is in the thickness T11 (see FIG. 6)). In the thickness T13, a sidewall 157sw2 (the sidewall of the opening 157 which is in the thickness T13) may be non-parallel with the sidewall 157sw1. Also, a bottom surface 157bw (a bottom wall or bottom surface of the opening 157 which is at the bottom of the thickness T13) may extend from the sidewall 155sw to the sidewall 157sw2. In some embodiments, the bottom surface 157bw may transition in a curved shape to the sidewall 157sw2. In some embodiments, the bottom surface 157bw may be perpendicular to both the sidewall 155sw and the sidewall 157sw1. A distance between the sidewall 155sw and the sidewall 157sw1 corresponds to the distance W6 and/or distance W7 (see FIG. 5).

Figure 7A:
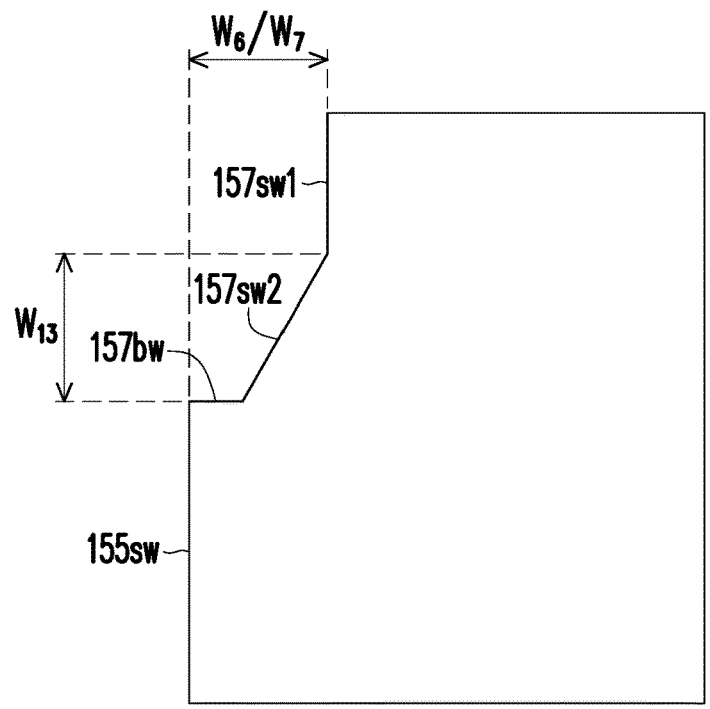
Figure 7B:
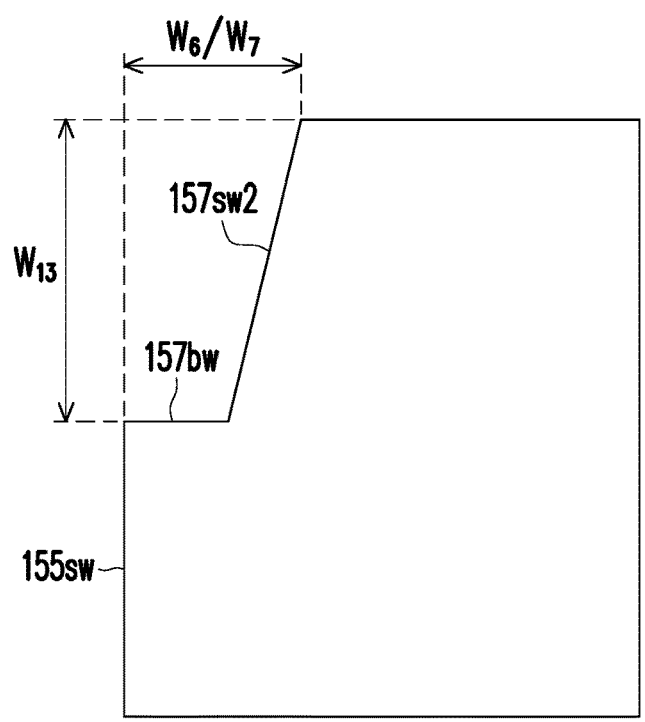
Figure 7C:
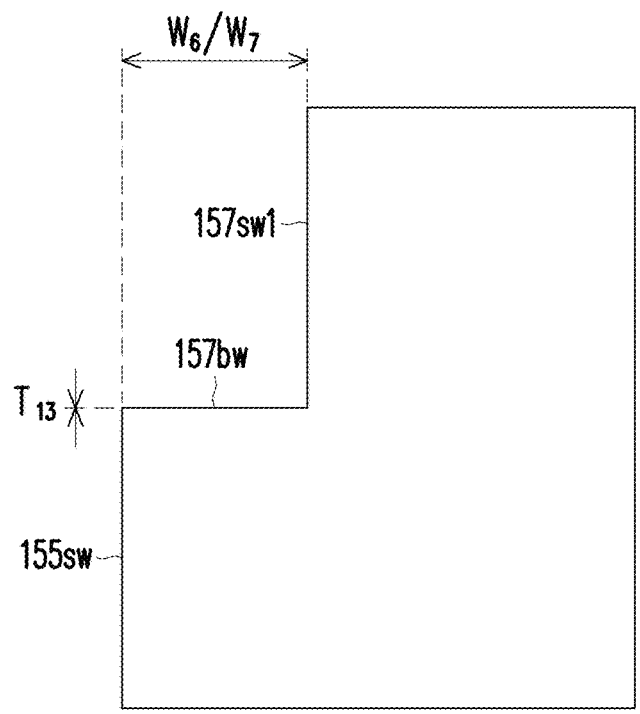
Figure 7D:
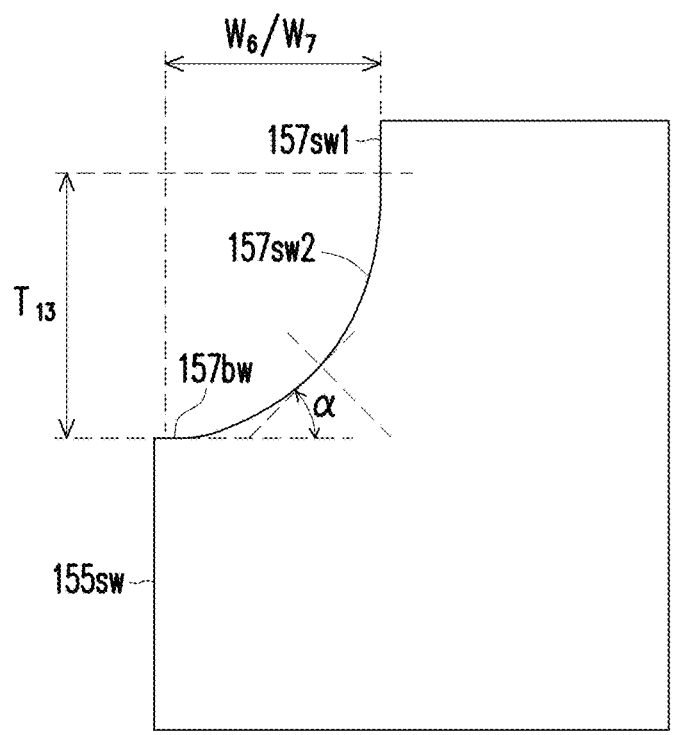

In FIG. 7A, the cutting process 152 of FIG. 5 leaves an angled portion for the sidewall 157sw2 in the transition area of the thickness $T_{13}$, in accordance with some embodiments. The width of the bottom surface 157bw may be between about 0 μm and about 100 μm, depending on the cutting process 152 utilized. In FIG. 7B, the cutting process 152 of FIG. 5 leaves an angled portion for the sidewall 157sw2 in the transition area of the thickness $T_{13}$, in accordance with some embodiments. FIG. 7B is similar to FIG. 7A, except that the thickness $T_{11}$ may be 0 μm, or in other words, the thickness $T_{13}$, may extend from the thickness $T_{12}$ up to the back surface of the device 105'. The width of the bottom surface 157bw may be between about 0 μm and about 50 μm, depending on the cutting process 152 utilized. In FIG. 7C, the shape of the sidewall profile of the device 105' forms a rectangular ledge. The thickness $T_{13}$ of the transition area is 0 μm, and the width of the bottom surface 157bw is equal to the distance $W_6$ and/or distance $W_7$. In FIG. 7D, the shape of the sidewall profile of the device 105' forms a curved surface through the thickness $T_{13}$ of the transition area. The sidewall 157sw2 extends down from the sidewall 157sw1 and begins to curve toward the sidewall 155sw. When the tangent of the curve passes through $\alpha=45°$ the sidewall 157sw2 transitions to the bottom surface 157bw of the opening 157. In some embodiments, the bottom surface 157bw may meet the sidewall 155sw at a non-perpendicular angle, while in other embodiments, the bottom surface 157bw may flatten out and meet the sidewall 155sw at a perpendicular angle. In such embodiments, after the bottom surface 157bw flattens out, it may continue a distance (e.g., similar to the bottom surface 157bw of FIG. 7B) until it meets the sidewall 155sw.

Figure 8:
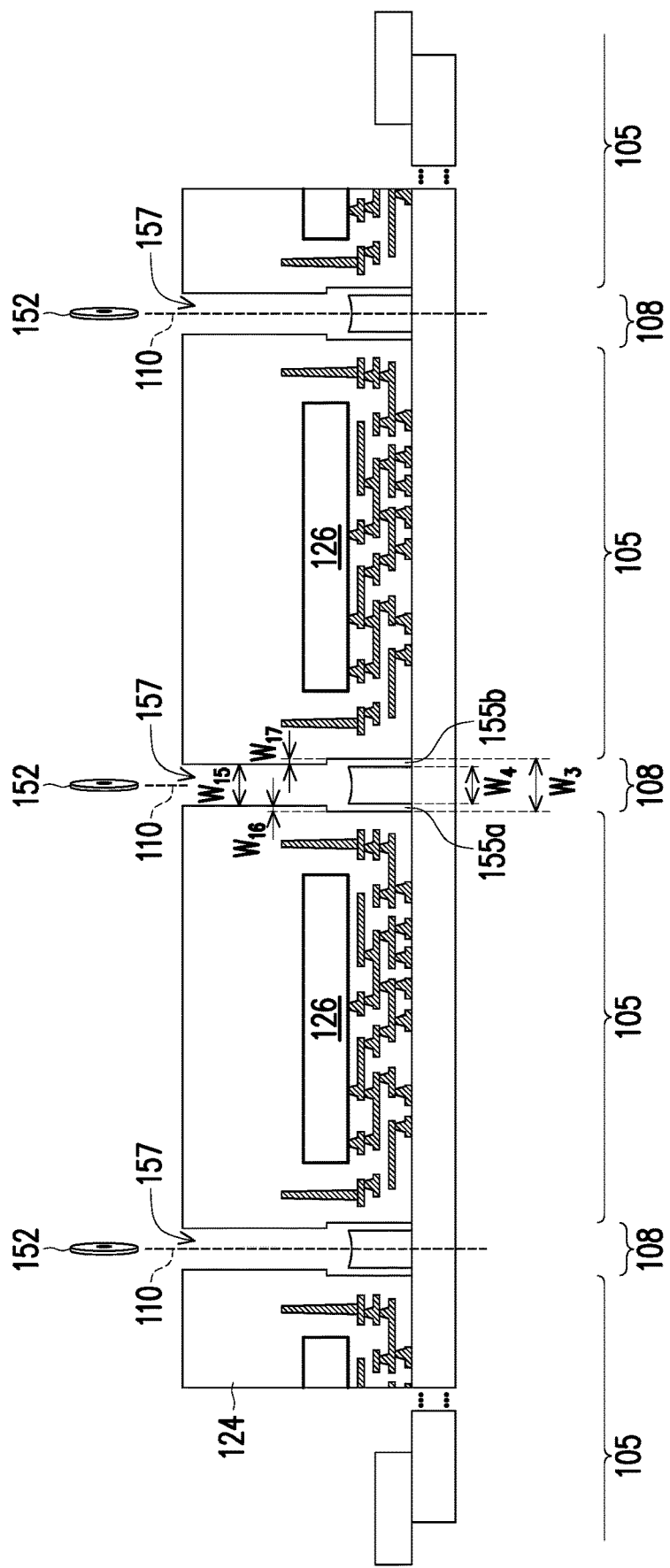

FIG. 8 illustrates a singulation process in accordance with other embodiments. FIG. 8 illustrates the wafer 100 of FIG. 5 with like reference numbers referring to like elements. In FIG. 8, the device regions 105 are singulated from one another using a cutting process 152 similar to the cutting process 152 of FIG. 5, except that the width $W_{15}$ of the opening 157 is narrower than the width $W_3$ from the outside surface of the opening 155a to the outside surface of the opening 155b. The width $W_{15}$, however, is also wider than the width $W_4$ from the inside surface of the opening 155a to the inside surface of the opening 155b. As such, when the opening 157 reaches the depth corresponding to the bottom of the openings 155a and 155b, the device region 105 is released from wafer 100 and the neighboring device regions 105.

Figure 9:
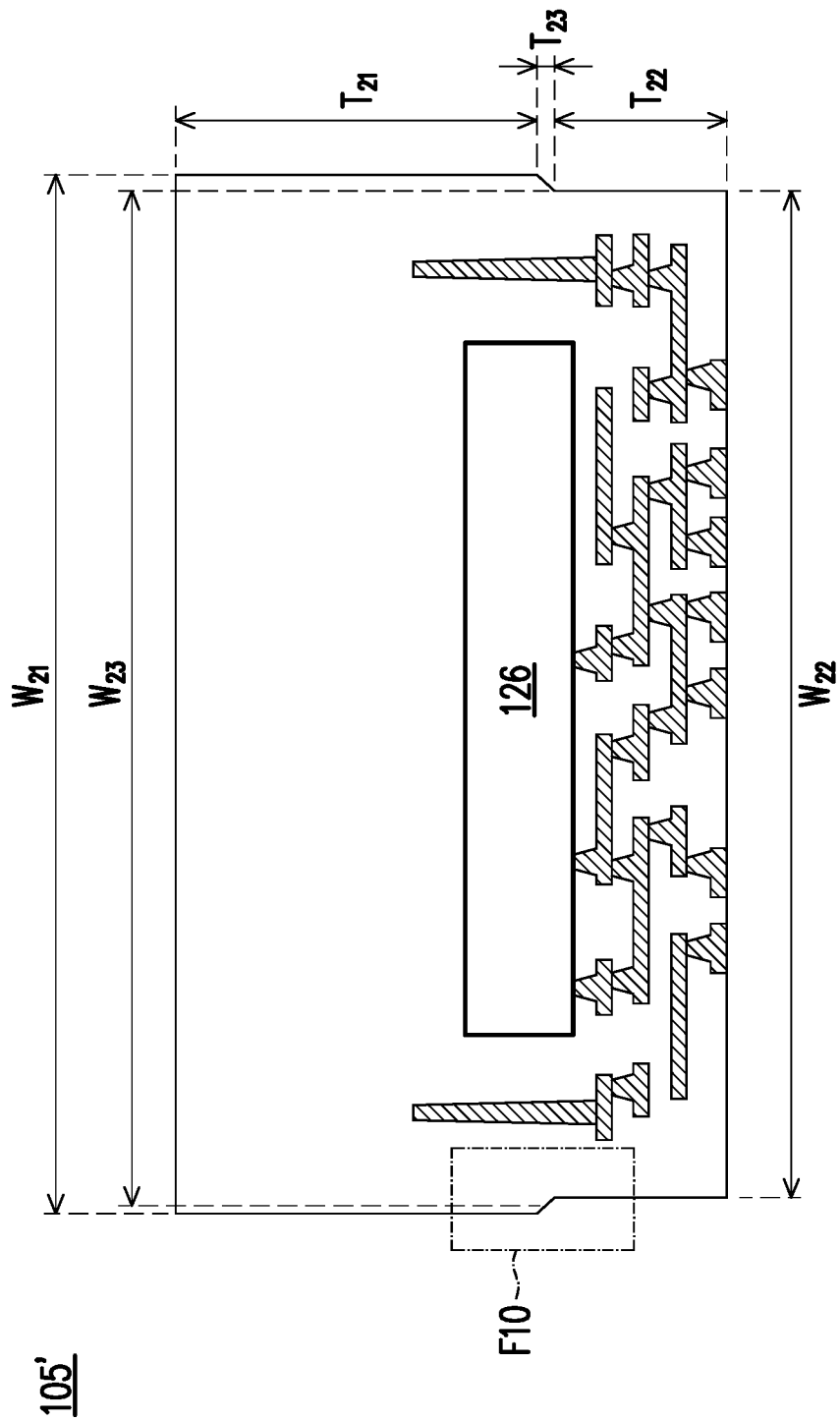

FIG. 9 illustrates the device 105' resulting from the singulation of the device regions 105. The device 105' has a first width W21 corresponding to the width of the substrate 124 and continuing for a thickness T21 of the device 105' as measured from a back side of the device 105'. The device 105' has a second width W22 corresponding to the width of the interconnect structure 128 and continuing for a thickness T22 of the device 105' as measured from the front side of the device 105' (i.e., at the front of the interconnect structure 128). The width W21 is greater than the width W22. The device 105' has a width W23, which may be a varying width as the device 105' transitions from the first width W21 to the second width W22. Thus, the width W23 corresponds to a thickness T23 of the device which is a thickness of the device interposed between the thickness T21 and the thickness T22. The dashed box F10 is shown in an enlarged view and discussed in further detail below.

Still referring to the device 105' of FIG. 9, it is appreciated that due to the precutting and singulation cutting processes, various relationships between these widths and thicknesses may be described. In accordance with some embodiments, the thicknesses T21 may be less than, equal to, or greater than the thickness T22. A ratio of the thicknesses T21 to T22 may be between about 40:1 and about 1:5. The thickness T23 may be less than the thickness T21. For example, the thickness T23 may be greater than or equal to zero. Further, the thickness T23 may be less than, equal to, or greater than the thickness T22. The thickness T22 plus the thickness T23 may be equal to the depth of the opening 155a (or 155b). The thickness T21 may be equal to the depth of the opening 157. Also, the sidewall roughness (e.g., root-mean-square (RMS) roughness) of the second thickness T22 and the third thickness T23 are each less than the sidewall roughness of the first thickness T21.

FIGS. 10A, 10B, 10C, and 10D illustrate enlarged sidewall profiles of the device 105', in accordance with various embodiments. FIGS. 10A, 10B, 10C, and 10D are similar to FIGS. 7A, 7B, 7C, and 7D, respectively, except flipped. In addition, because the lower sidewalls are from the first openings 155a and/or 155b, the sidewalls of the thickness T23 (the transitionary thickness from the thickness T21 to the thickness T22) are formed from the first openings 155a and/or the second openings 155b rather than the openings 157. In particular the transition in the thickness T23 is shown which extends between the sidewall 155sw1 (the sidewall of the opening 155a or the opening 155b) and the sidewall 157*sw* (the sidewall of the opening 157 which is in the thickness T21 (see FIG. 9). In the thickness T23, a sidewall 155*sw*2 (the sidewall of the opening 155*a* or 155*b* which is in the thickness T23) may be non-parallel with the sidewall 157*sw*. Also, a top surface 155*tw* (a top wall or top surface of the opening 155*a* or 155*b* which is at the top of the thickness T23) may extend from the sidewall 157*sw* to the sidewall 155*sw*2. In some embodiments, the top surface 155*tw* may transition in a curved shape to the sidewall 155*sw*1. In some embodiments, the top surface 155*tw* may be perpendicular to both the sidewall 157*sw* and the sidewall 155*sw*1. A distance between the sidewall 157*sw* and the sidewall 155*sw*1 corresponds to the width W16 and/or width W17 (see FIG. 8).

Figure 10A:
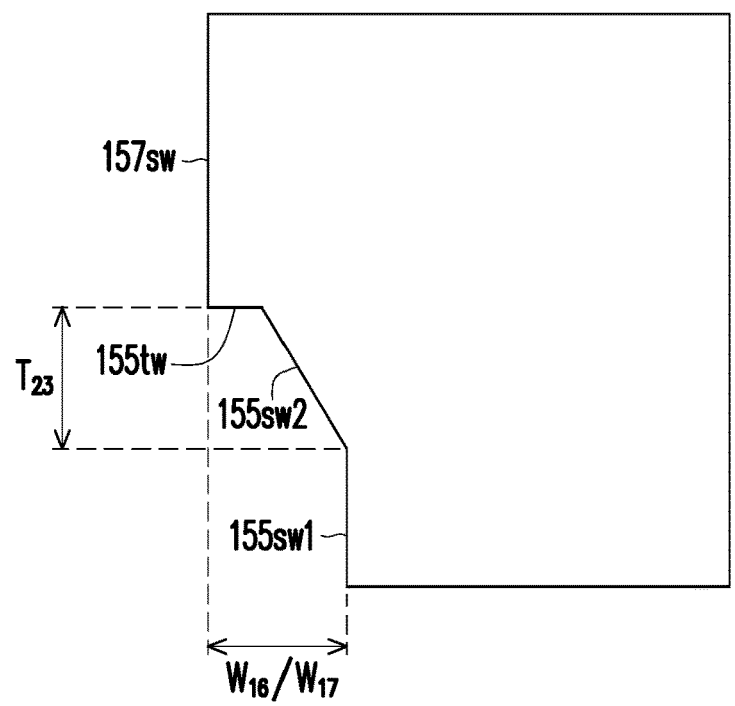
Figure 10B:
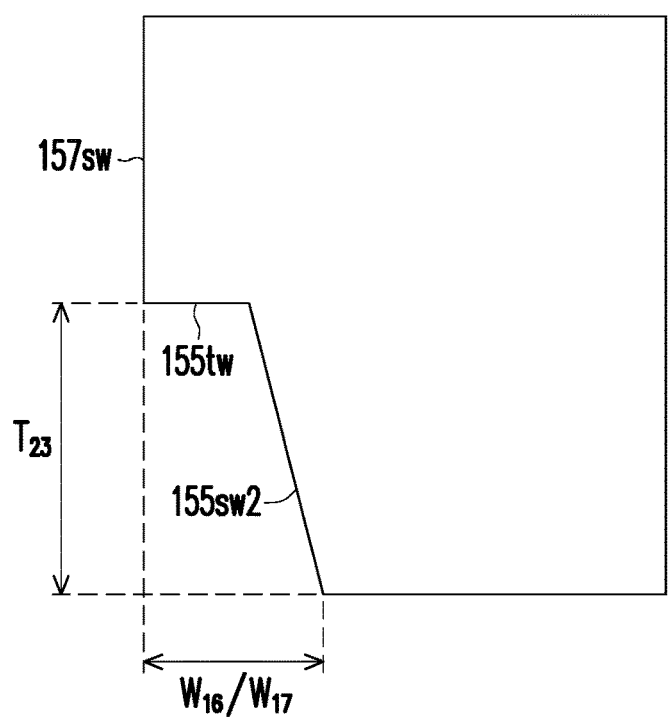
Figure 10C:
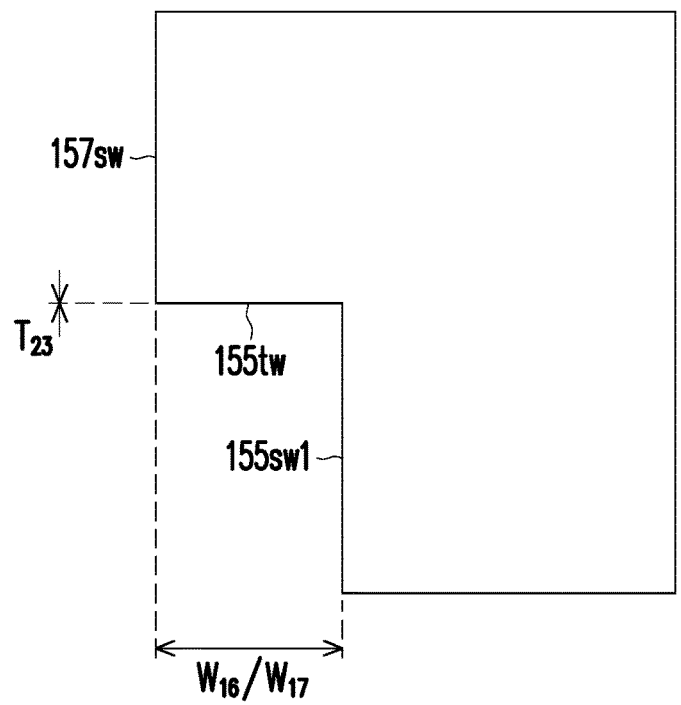
Figure 10D:
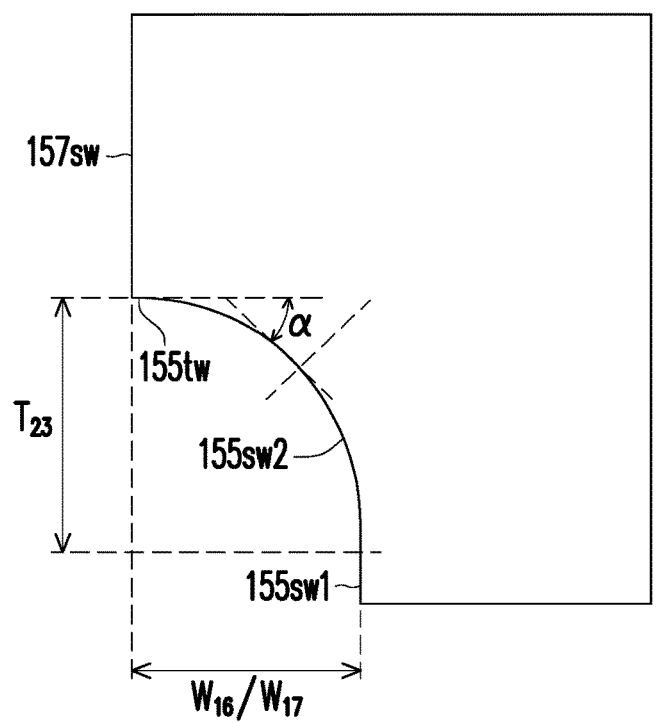

In FIG. 10A, the cutting process 152 of FIG. 3 in combination with the cutting process 152 of FIG. 8 leaves an angled portion for the sidewall 155*sw*2 in the transition area of the thickness $T_{23}$, in accordance with some embodiments. The width of the top surface 155*tw* may be between about 0 μm and about 100 μm, depending on the cutting process 152 utilized. In FIG. 10B, the cutting process 152 of FIG. 3 in combination with the cutting process 152 of FIG. 8 leaves an angled portion for the sidewall 155*sw*2 in the transition area of the thickness $T_{23}$, in accordance with some embodiments. FIG. 10B is similar to FIG. 10A, except that the thickness $T_{22}$ may be 0 μm, or in other words, the thickness $T_{23}$, may extend from the thickness $T_{21}$ down to the front surface of the device 105'. The width of the top surface 155*tw* may be between about 0 μm and about 50 μm, depending on the cutting process 152 utilized. In FIG. 10C, the shape of the sidewall profile of the device 105' forms a rectangular ledge. The thickness $T_{23}$ of the transition area is 0 μm, and the width of the top surface 155*tw* is equal to the width $W_{16}$ and/or width $W_{17}$. In FIG. 10D, the shape of the sidewall profile of the device 105' forms a curved surface through the thickness $T_{23}$ of the transition area. The sidewall 155*sw*2 extends up from the sidewall 155*sw*1 and begins to curve toward the sidewall 157*sw*. When the tangent of the curve passes through α=45°, the sidewall 155*sw*2 transitions to the top surface 155*tw* of the opening 155*a* or 155*b*. In some embodiments, the top surface 155*tw* may meet the sidewall 157*sw* at a non-perpendicular angle, while in other embodiments, the top surface 155*tw* may flatten out and meet the sidewall 157*sw* at a perpendicular angle. In such embodiments, after the top surface 155*tw* flattens out, it may continue a distance (e.g., similar to the top surface 155*tw* of FIG. 10B) until it meets the sidewall 157*sw*.

Each of the sidewall profiles of FIGS. 7A, 7B, 7C, and 7D are indented further at the top (the substrate 124 side of the device 105') than the bottom (the interconnect structure 128 side of the device 105'), and result in a distance W6 or distance W7 which denotes the indent distance of the indented top portions of the sidewall profiles. This type of indentation may be referred to as an indent top sidewall profile. In contrast, each of the sidewall profiles of FIGS. 10A, 10B, 10C, and 10D are indented further at the bottom than the top of the device 105', and result in a width W16 or width W17 which denotes the indent distance of the indented bottom portions of the sidewall profiles. This type of indentation may be referred to as an indent bottom sidewall profile.

Figure 11:
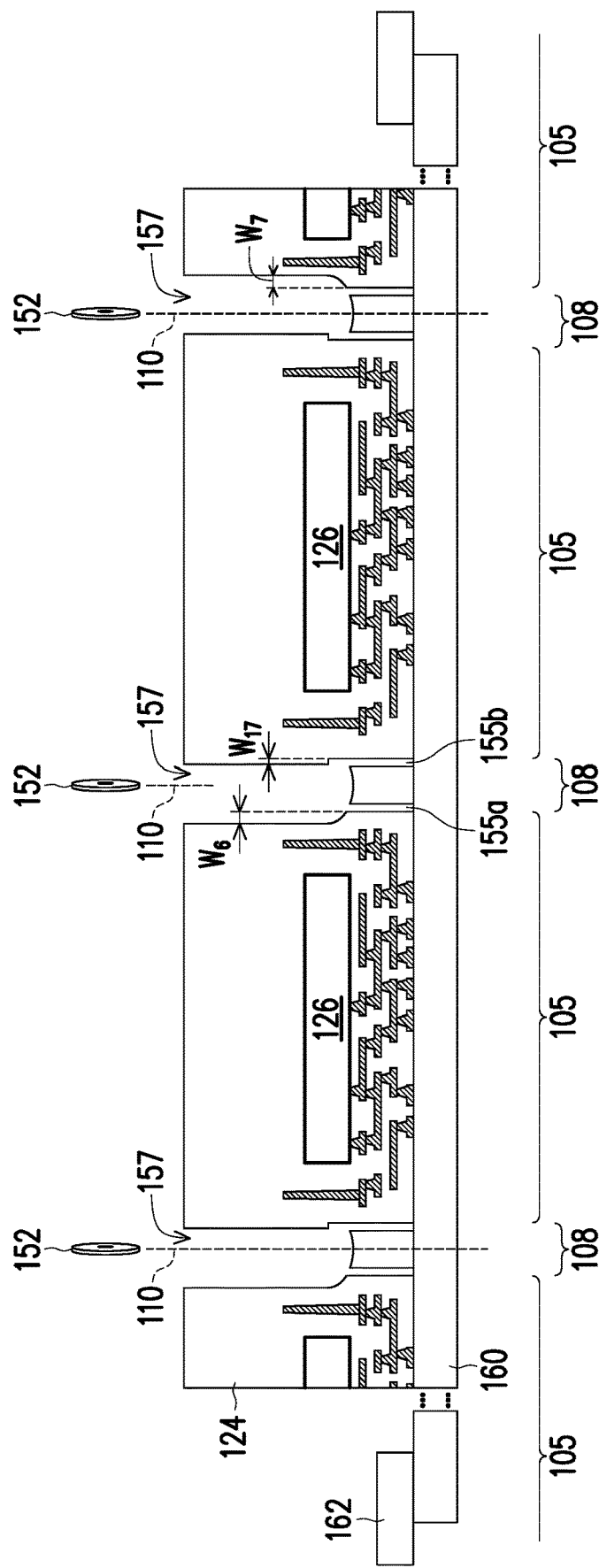
FIGS. 11 through 13 illustrate various views of intermediate processes of singulating a device die from a wafer, in accordance with some embodiments.

FIG. 11 illustrates a singulation process in accordance with some embodiments. FIG. 11 illustrates the wafer 100 of FIG. 5 with like reference numbers referring to like elements. In FIG. 11, the device regions 105 are singulated from one another using a cutting process 152 similar to the cutting process 152 of FIG. 5, except for two variations in the cutting of the opening 157. In some embodiments, the alignment of the opening 157 is skewed from the dicing line 110. In some embodiments, the opening 157 is wider in some cuts versus other cuts. These differences can result in devices 105' which have a mix match of the sidewall profiles, i.e., some sides of the same device 105' having indent top sidewall profiles and other sides of the same device 105' having indent bottom sidewall profiles. In addition, in some embodiments, the sidewall profiles can be flat or nearly flat for some sides and indented on other sides of the device 105'.

Figure 12A:
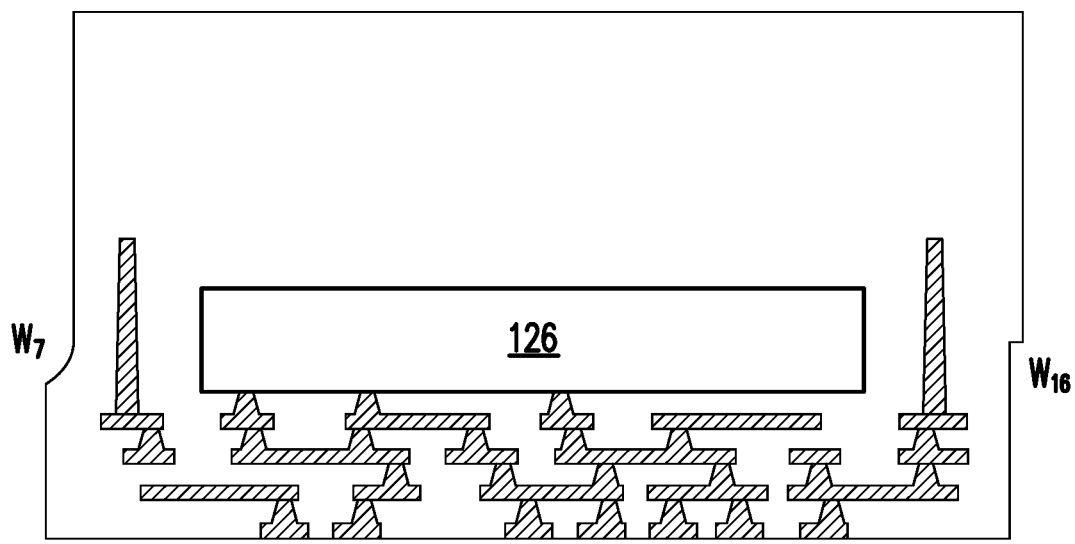
Figure 12B:
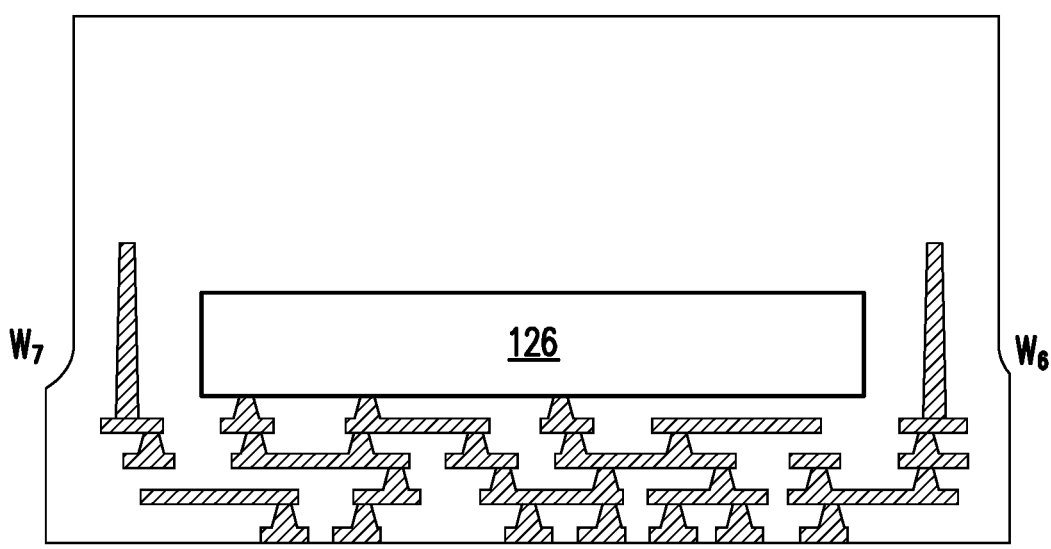
Figure 12C:
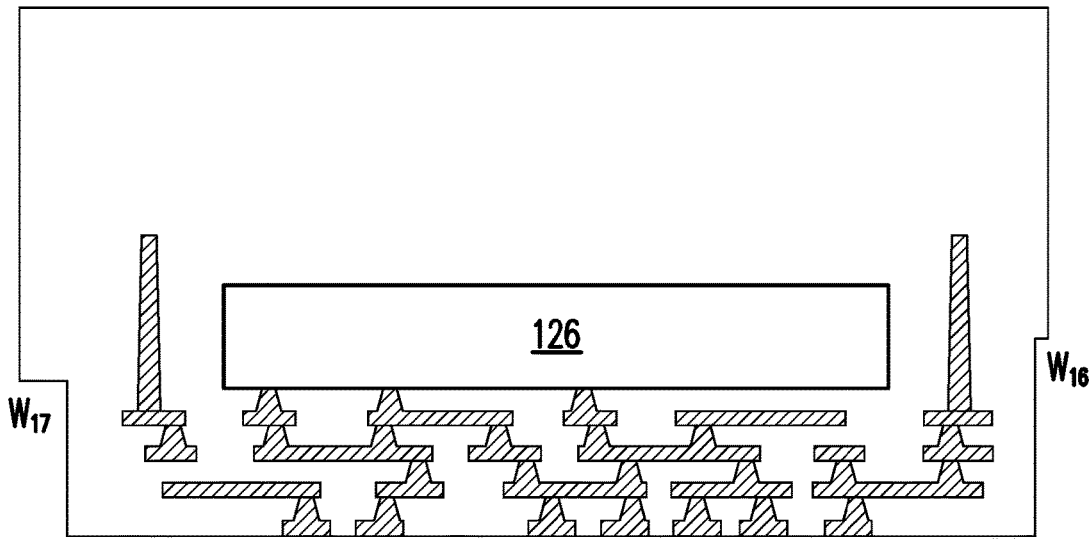
Figure 12D:
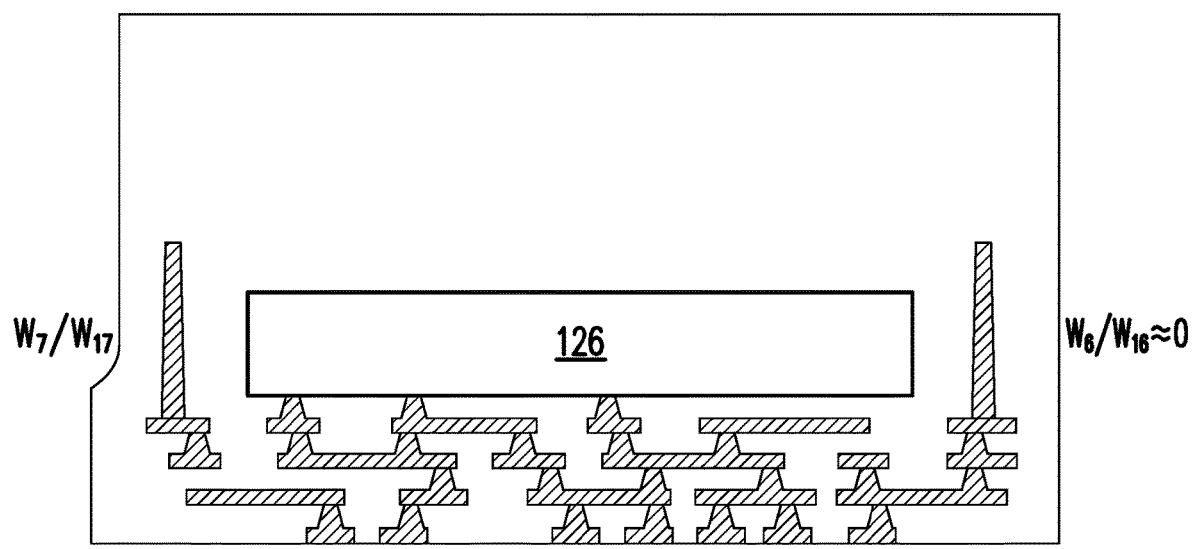

FIGS. 12A, 12B, 12C, and 12D illustrate several different variations which may be realized from misalignment of the openings 157 and size variations of the openings 157. In FIG. 12A, one side of the device 105' has an indent top sidewall profile with an indent width W7 and the other side of the device has an indent bottom sidewall profile with an indent width W16. In FIG. 12B, one side of the device 105' has an indent top sidewall profile with an indent distance W7 and the other side of the device 105' has an indent top sidewall profile with an indent distance W6, where distance W6<distance W7. In FIG. 12C, one side of the device 105' has an indent bottom sidewall profile with an indent width W17 and the other side of the device 105'has an indent bottom sidewall profile with an indent width W16, where width W16< width W17. In FIG. 12D, one side of the device 105' has an indent bottom or an indent top sidewall profile with an indent width W17 or distance W7 and the other side of the device has flat sidewall profile (neither top nor bottom indented or no indent), or in other words distance W6 and width W16 are about 0 μm.

Figure 13:
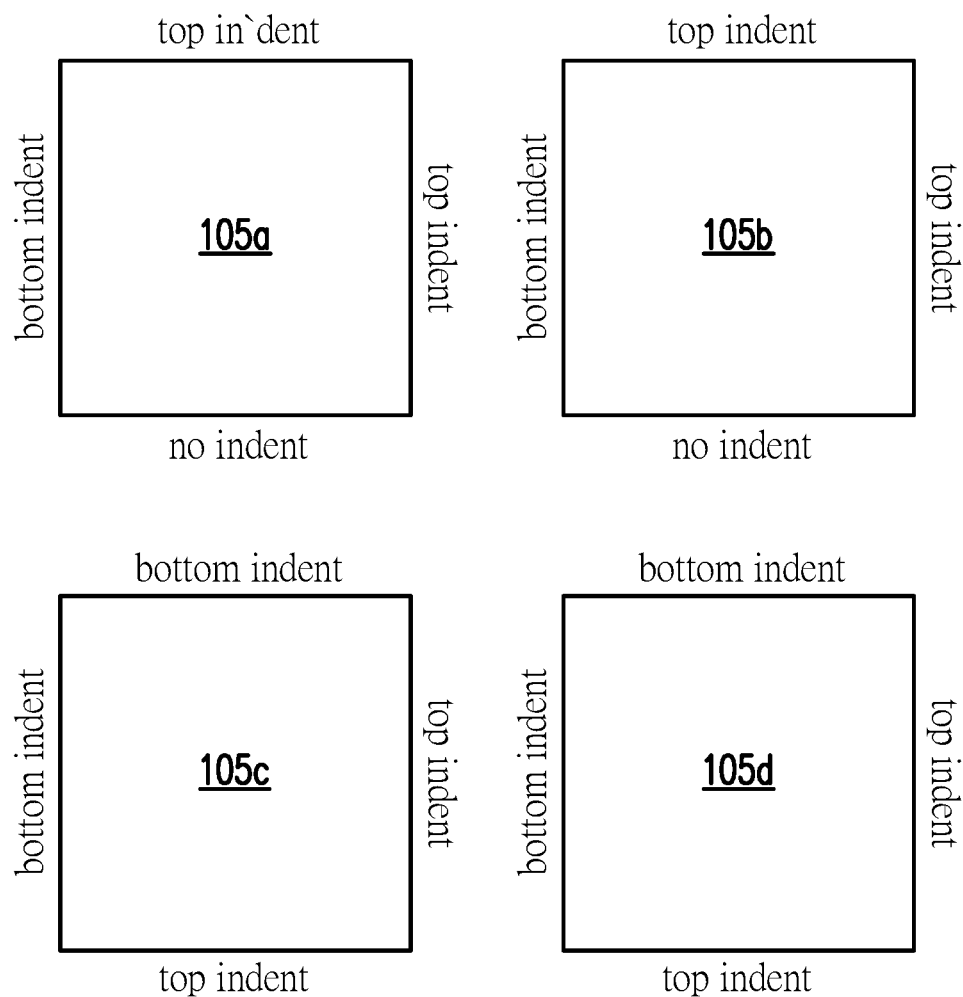

FIG. 13 illustrates an example of four devices 105' (e.g., 105*a*, 105*b*, 105*c*, and 105*d*), which each have different indentation schemes for each of the sides. It is noted that even if the device 105*a*, 105*b*, 105*c*, and 105*d* has two sides with the same type of indentation, the value for the indentation (e.g., distance $W_6$ or width $W_{16}$) may be different from the value for the other of the same type.

Figure 14A:
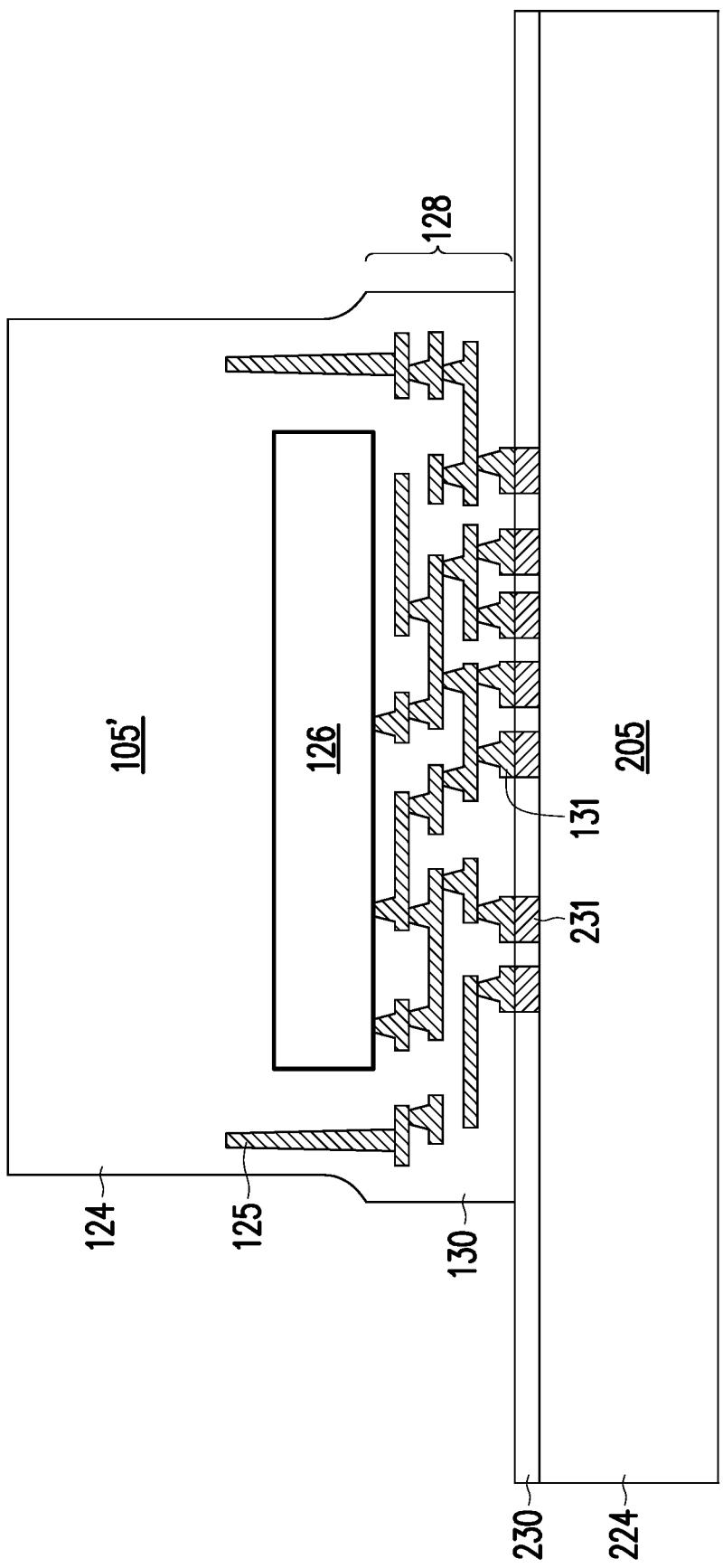
FIGS. 14A, 14B, 14C, and 14D illustrate various vies of a process of attaching a device die to another device die, in accordance with some embodiments.
Figure 14B:
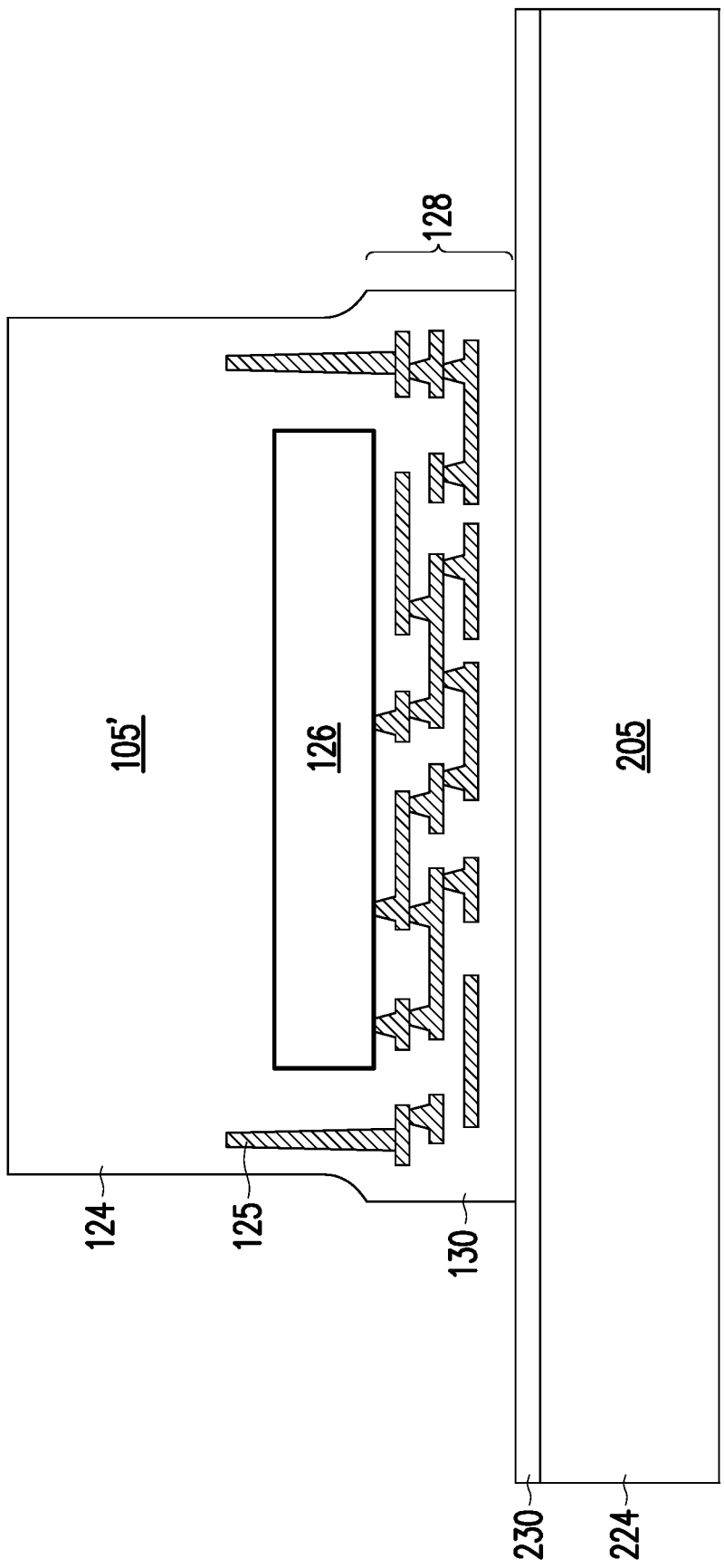
Figure 14C:
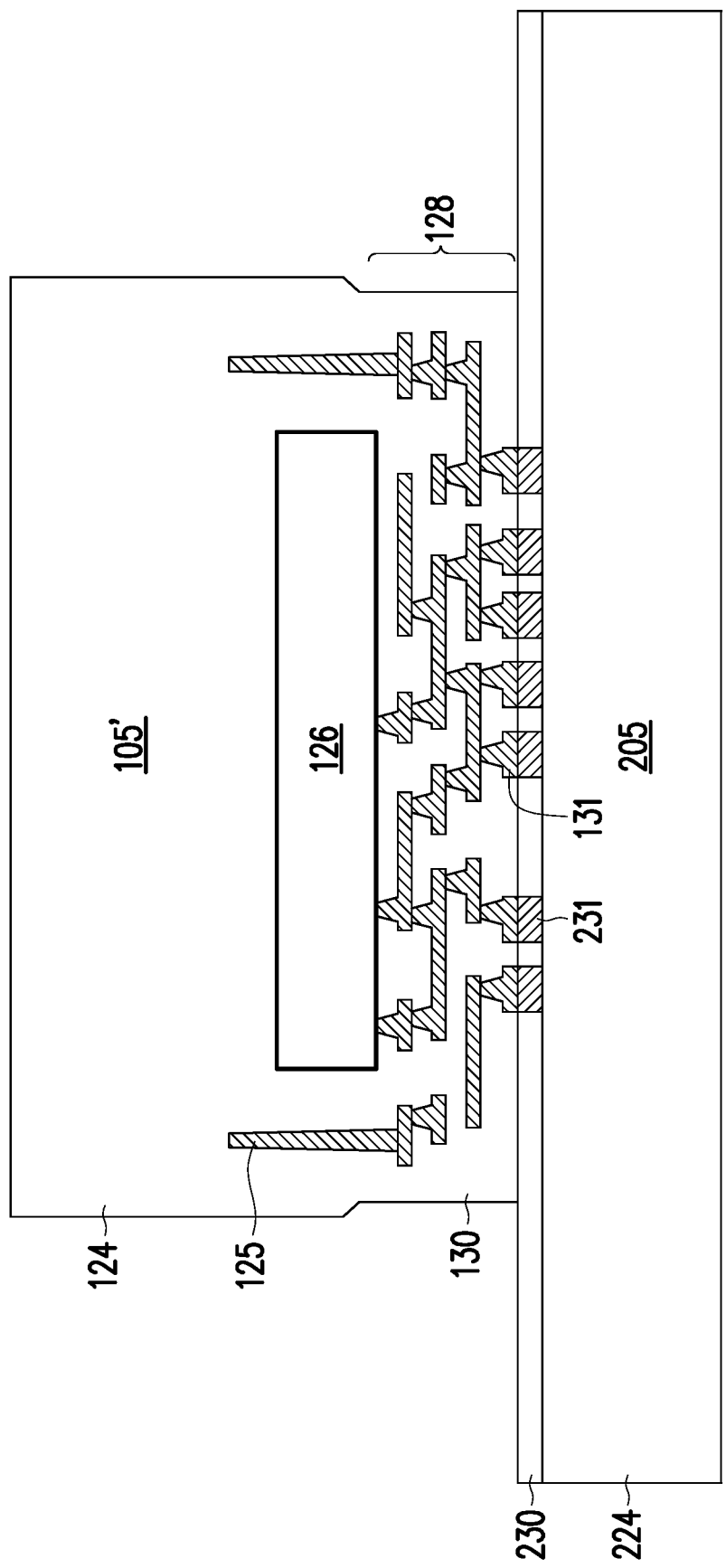
Figure 14D:
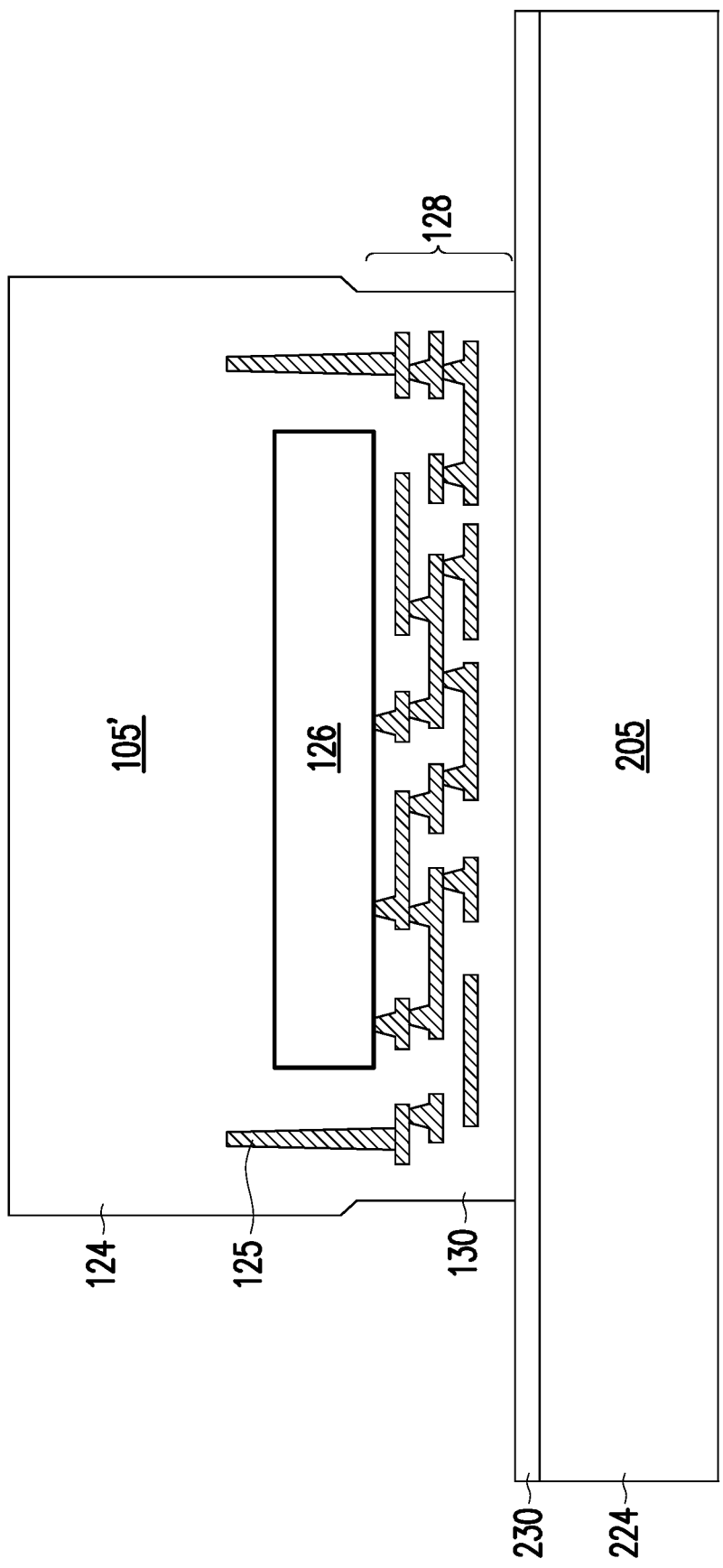

In FIGS. 14A, 14B, 14C, and 14D the device 105' is mounted to a structure 205. The structure 205 may be a die, a wafer, or a carrier. In embodiments where the structure 205 is a die, the die 205 may include a semiconductor substrate 224. The semiconductor substrate 224 may be any of the candidate substrate types as those provided above for the semiconductor substrate 124. The semiconductor substrate 224 may have active and/or passive devices formed therein. As illustrated in FIGS. 14A and 14C, contacts 231 may be formed at an upper surface thereof and optionally surrounded laterally by a suitable dielectric layer 230. The dielectric layer 230 may, for example, in some embodiments include silicon oxide, silicon oxycarbide, silicon nitride, the like, and so forth. The dielectric layer 230 may be considered a bonding dielectric layer in some embodiments. In some embodiments, the devices 105' may be attached to the die 205 by a pick and place process and bonded to the die 205 by solder or by direct metal-to-metal bonding and fusion bonding of the dielectric layer 230 with the dielectric layer 130. As illustrated in FIGS. 14B and 14D, some embodiments may not utilize the contacts 231, and the device 105' may be attached to the die 205 by an adhesive or by an optional dielectric layer 230. In some embodiments, the device 105' may be attached face side up (i.e., with the interconnect structure 128 disposed at the top) and conductors may be formed laterally apart from the device 105' to couple to the interconnect structure 128 of the device 105' to the die 205.

In embodiments where the structure 205 is a wafer, the wafer 205 may be like unto the wafer 100, with multiple device regions formed therein, and several of the devices 105' may be attached thereto in the device regions of the wafer 205. The devices 105' may be attached in a manner similar to those discussed above with respect to the die 205 embodiment. Subsequent processes may be used to utilize the device 105' on the wafer 205, including, for example, singulating the wafer 205 to form packages of devices including the device 105'.

In embodiments where the structure 205 is a carrier, the carrier 205 may be a glass carrier, a silicon wafer, an organic carrier, or the like. Carrier 205 may have a round top-view shape in accordance with some embodiments. The dielectric layer 230 of FIGS. 14B and 14D may be seen as corresponding to a release film which may be formed of a polymer-based material and/or an epoxy-based thermal-release material (such as a Light-To-Heat-Conversion (LTHC) material), which is capable of being decomposed under radiation such as a laser beam, so that carrier 205 may be de-bonded from the overlying structures that will be formed or attached. In accordance with some embodiments of the present disclosure, the release film is coated onto carrier 205. The device 105' may then be attached to the carrier 205 by way of the release film or by another suitable attachment process. Subsequent processes may be used to utilize the device 105' on the carrier 205.

The die 205 includes a substrate 224 which may have active or passive devices formed therein, where distance W6<distance W7. In FIG. 12C, one side of the device 105' has an indent bottom sidewall profile with an indent width W17 and the other side of the device has an indent bottom sidewall profile with an indent width W16, where width W16<width W17. In FIG. 12D, one side of the device 105' has an indent bottom or an indent top sidewall profile with an indent width W17 or distance W7 and the other side of the device has flat sidewall profile (neither top nor bottom indented or no indent), or in other words distance W6 and width W16 are about 0 μm.

Embodiments may achieve advantages. The precutting process utilizes a cutting process that produces relatively small openings in the front side of a device wafer. Because the openings are small, they may be easily cleaned and provide less damage or potential for damage to the front side devices and structures located at the front side of the device wafer. The device wafer is flipped and then cut again through the back side. The larger back side cut joins the two smaller openings in the front to achieve the full cutting through the device wafer. Even though the larger back side cut may generate more byproducts and debris than the first front side cuts, because the device wafer is face down, the face is protected by being attached to a tape. Utilizing the precutting process and then completing the cutting process by cutting the back side of the device wafer provides less debris, less chipping (especially near more significant structures), and reduces cracking and delamination risks.

One embodiment is a method including cutting a first opening and a second opening along a dicing line of a device wafer. The method also includes flipping the device wafer over and attaching it to a tape. The method also includes cutting a third opening along the dicing line of the device wafer, the third opening joining the first opening to completely separate a device die from the device wafer, a sidewall of the device die having an indentation corresponding to the first opening or the third opening. In an embodiment, the dicing line is in a dicing region of the device wafer, where the dicing region is free of electrically conductive features. In an embodiment, the first opening and the second opening are laterally separated from each other. In an embodiment, the first opening and the second opening extend through an interconnect structure. In an embodiment, forming the first opening and the second opening includes using a plasma cutting process, an etching cutting process, a saw, or laser beam. In an embodiment, the third opening is centered laterally between the first opening and the second opening. In an embodiment, a width of the third opening is wider than a width between a first sidewall of the first opening closest to a first device region and a second sidewall of the second opening closest to a second device region. In an embodiment, the indentation of the sidewall of the device die corresponds to the first opening. In an embodiment, the method further includes attaching the device die to a second die to form a package device.

Another embodiment is a method including singulating a device die from a wafer, the singulating including: forming a pair of parallel trenches in a front side of the wafer, the pair of parallel trenches extending through a front-side interconnect and into a semiconductor substrate of the wafer, turning the wafer over and securing the front side of the wafer, and forming a third trench parallel to the pair of parallel trenches, the third trench having a center-line between the pair of parallel trenches. The method also includes cleaning debris or byproducts resulting from forming the third trench, the front side of the wafer protected during the cleaning. In an embodiment, the third trench is formed by sawing, plasma cutting, etching, or laser cutting. In an embodiment, a width between outer surfaces of the pair of parallel trenches is a first width, a width between inner surfaces of the pair of parallel trenches is a second width, and a width of the third trench is between the first width and the second width. In an embodiment, an indentation in a sidewall surface of the device die extends from a back-side surface of the wafer to a depth of the third trench. In an embodiment, the indentation transitions to an outer portion of the sidewall surface by an angle or curve in the sidewall surface. In an embodiment, the method further includes forming a separated section of the front-side interconnect from a portion of the front-side interconnect between the pair of parallel trenches; and disposing of the separated section.

Another embodiment is a structure including a device area embedded in a semiconductor substrate of a first device, the semiconductor substrate continuing below the device area. The structure also includes an interconnect structure disposed over the device area at a front-side of the first device. The structure also includes a side surface of the first device, the side surface including a first portion, a second portion, and a third portion, the first portion being indented from the third portion, the second portion providing a transition between the first portion and the third portion. In an embodiment, the first portion is in line with the interconnect structure. In an embodiment, the second portion has a curved profile or an angled profile. In an embodiment, the second portion has a thickness of 0 μm. In an embodiment, a first side surface of the first device has an indentation corresponding to the first portion, where a second side surface of the first device has an indentation corresponding to the third portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   cutting a first opening and a second opening along a dicing line of a device wafer, wherein the device wafer comprises a semiconductor substrate and an interconnect structure on a first side of the semiconductor substrate, wherein the first opening and the second opening extend through the interconnect structure and into the semiconductor substrate, wherein the dicing line is in a dicing region of the device wafer, wherein the dicing region is free of electrically conductive features;
   flipping the device wafer over and attaching it to a tape; and
   cutting a third opening along the dicing line of the device wafer, the third opening joining the first opening to completely separate a first device die from the device wafer, a sidewall of the first device die having an indentation corresponding to the first opening or the third opening.

2. The method of claim 1, wherein the first opening and the second opening are laterally separated from each other.

3. The method of claim 1, wherein cutting the first opening and the second opening comprises using a plasma cutting process, an etching cutting process, a saw, or a laser beam.

4. The method of claim 1, wherein the third opening is centered laterally between the first opening and the second opening.

5. The method of claim 1, wherein the device wafer comprises a second device die adjacent the first device die, wherein a width of the third opening is wider than a width between a first sidewall of the first opening closest to the first device die and a second sidewall of the second opening closest to the second device die.

6. The method of claim 1, wherein the indentation of the sidewall of the first device die corresponds to the first opening.

7. The method of claim 1, further comprising attaching the first device die to a third device die to form a package device.

8. The method of claim 1, wherein the device wafer includes a through via in the semiconductor substrate, wherein the through via is not exposed when cutting the third opening.

9. The method of claim 1, wherein a width of the third opening is narrower than a width between a first sidewall of the first opening distal from the second opening and a second sidewall of the second opening distal from the first opening.

10. A method comprising:
    singulating a device die from a wafer, the singulating comprising:
        forming a pair of parallel trenches in a front side of the wafer, the pair of parallel trenches extending through a front-side interconnect and into a semiconductor substrate of the wafer,
        turning the wafer over and securing the front side of the wafer, and
        forming a third trench parallel to the pair of parallel trenches, the third trench having a center-line between the pair of parallel trenches; and
    cleaning debris or byproducts resulting from forming the third trench, the front side of the wafer protected during the cleaning.

11. The method of claim 10, wherein the third trench is formed by sawing, plasma cutting, etching, or laser cutting.

12. The method of claim 10, wherein a width between outer surfaces of the pair of parallel trenches is a first width, wherein a width between inner surfaces of the pair of parallel trenches is a second width, and wherein a width of the third trench is between the first width and the second width.

13. The method of claim 10, wherein an indentation in a sidewall surface of the device die extends from a back-side surface of the wafer to a depth of the third trench.

14. The method of claim 13, wherein the indentation transitions to an outer portion of the sidewall surface by an angle or curve in the sidewall surface.

15. The method of claim 10, further comprising forming a separated section of the front-side interconnect from a portion of the front-side interconnect between the pair of parallel trenches; and
    disposing of the separated section.

16. A method comprising:
    forming a first trench and a second trench in a first side of a substrate structure, the first trench and the second trench being between a first die region and a second die region, the substrate structure comprising a substrate and an interconnect structure over the substrate, wherein the first trench and the second trench extend through the interconnect structure and into the substrate, wherein the substrate structure includes a through via extending into the substrate towards a second side of the substrate structure; and
    forming a third trench in a second side of the substrate structure, the third trench exposing the first trench and the second trench, wherein the through via is not exposed on the second side of the substrate structure when forming the third trench.

17. The method of claim 16, wherein forming the first trench and the second trench comprises a cutting process.

18. The method of claim 16, wherein a width of the third trench is wider than a distance between a first sidewall of the first trench and a second sidewall of the second trench, the first sidewall facing away from the second trench, the second sidewall facing away from the first trench.

19. The method of claim 16, wherein after forming the first trench, the second trench, and the third trench, a sidewall of the first die region has an indent.

20. The method of claim 16, wherein a width of the third trench is narrower than a distance between outer sidewalls of the first trench and the second trench.

* * * * *